US008934647B2

(12) United States Patent
Joyce et al.

(10) Patent No.: US 8,934,647 B2
(45) Date of Patent: Jan. 13, 2015

(54) ORIENTATION-RESPONSIVE ACOUSTIC DRIVER SELECTION

(75) Inventors: John Joyce, Canton, MA (US); Eric J. Freeman, Sutton, MA (US)

(73) Assignee: Bose Corporation, Framingham, MA (US)

( * ) Notice: Subject to any disclaimer, the term of this patent is extended or adjusted under 35 U.S.C. 154(b) by 656 days.

(21) Appl. No.: 13/086,976

(22) Filed: Apr. 14, 2011

(65) Prior Publication Data

US 2012/0263324 A1 Oct. 18, 2012

(51) Int. Cl.

| | |
|---|---|
| ***H03F 99/00*** | (2009.01) |
| ***H04R 1/02*** | (2006.01) |
| ***H04R 3/12*** | (2006.01) |
| *H04R 5/02* | (2006.01) |
| *H04R 5/04* | (2006.01) |
| *H04R 1/26* | (2006.01) |
| *H04S 3/00* | (2006.01) |

(52) U.S. Cl.

CPC .. *H04R 3/12* (2013.01); *H04R 5/02* (2013.01); *H04R 5/04* (2013.01); *H04R 1/26* (2013.01); *H04S 3/00* (2013.01); *H04R 2203/12* (2013.01); *H04R 2430/01* (2013.01)

USPC .............. 381/120; 381/59; 381/300; 381/304

(58) Field of Classification Search

CPC ....... H04B 1/40; H04B 7/0617; H04B 7/0673

USPC ........... 381/387, 306, 307, 386, 333, 336, 17, 381/300, 304, 59; 348/168, 146

See application file for complete search history.

(56) References Cited

U.S. PATENT DOCUMENTS

| | | | | |
|---|---|---|---|---|
| 3,449,519 | A | 6/1969 | Mowry | |
| 4,054,750 | A | 10/1977 | Montgomery et al. | |
| 5,784,468 | A | 7/1998 | Klayman | |
| 5,953,432 | A | 9/1999 | Yanagawa et al. | |
| 6,996,243 | B2 | 2/2006 | Welker et al. | |
| 7,092,541 | B1 | 8/2006 | Eberbach | |
| 7,346,315 | B2 * | 3/2008 | Zurek et al. | 455/90.3 |
| 8,103,009 | B2 * | 1/2012 | McCarty et al. | 381/58 |
| 8,139,774 | B2 | 3/2012 | Berardi et al. | |
| 8,184,835 | B2 | 5/2012 | Goodwin | |
| 8,265,310 | B2 | 9/2012 | Berardi et al. | |

(Continued)

FOREIGN PATENT DOCUMENTS

| | | | |
|---|---|---|---|
| DE | 102008059036 | A1 | 5/2010 |
| JP | 2007181098 | A | 7/2007 |

OTHER PUBLICATIONS

Invitation to Pay Additional Fees dated Jul. 6, 2012 for PCT/2012/033437.

(Continued)

*Primary Examiner* — Davetta W Goins
*Assistant Examiner* — Oyesola C Ojo

(57) ABSTRACT

An audio device incorporates a first acoustic driver having a first direction of maximum acoustic radiation and a second acoustic driver having a second direction of maximum acoustic radiation, where the first and second directions of maximum acoustic radiation are not in parallel, and where the audio device employs the first acoustic driver or the second acoustic driver in acoustically outputting a sound of a predetermined range of frequencies in response to the orientation of the casing of the audio device relative to the direction of the force of gravity.

18 Claims, 11 Drawing Sheets

(56) References Cited

U.S. PATENT DOCUMENTS

| | | | | |
|---|---|---|---|---|
| 8,310,458 | B2 * | 11/2012 | Faubert et al. | 345/173 |
| 8,320,596 | B2 | 11/2012 | Ishibashi et al. | |
| 8,340,315 | B2 * | 12/2012 | Kantola | 381/92 |
| 8,351,630 | B2 | 1/2013 | Ickler et al. | |
| 8,542,854 | B2 | 9/2013 | Riggs et al. | |
| 2001/0011993 | A1 * | 8/2001 | Saarinen | 345/156 |
| 2003/0179899 | A1 | 9/2003 | Welker et al. | |
| 2004/0245043 | A1 | 12/2004 | Noselli et al. | |
| 2005/0063559 | A1 * | 3/2005 | Lee et al. | 381/335 |
| 2008/0031474 | A1 * | 2/2008 | Berardi et al. | 381/99 |
| 2009/0190787 | A1 * | 7/2009 | Pieklik et al. | 381/386 |
| 2009/0238372 | A1 * | 9/2009 | Hsu | 381/61 |
| 2009/0274329 | A1 | 11/2009 | Ickler et al. | |
| 2009/0279721 | A1 * | 11/2009 | Tanaka | 381/303 |
| 2010/0008523 | A1 | 1/2010 | Demuynck et al. | |
| 2011/0026744 | A1 | 2/2011 | Jankovsky et al. | |
| 2011/0064254 | A1 | 3/2011 | Li et al. | |
| 2011/0216924 | A1 | 9/2011 | Berardi et al. | |
| 2012/0263335 | A1 * | 10/2012 | Breen et al. | 381/387 |

OTHER PUBLICATIONS

International Search Report and Written Opinion dated Sep. 10, 2012 for PCT/US2012/033437.

Extended European Search Report dated Nov. 21, 2014 for European Application No./Patent No. 14177513.0-1901.

* cited by examiner

ORIENTATION-RESPONSIVE ACOUSTIC DRIVER SELECTION

TECHNICAL FIELD

This disclosure relates to altering aspects of the acoustic output of an audio device in response to its physical orientation.

BACKGROUND

Audio systems in home settings and other locations employing multiple audio devices positioned about a listening area of a room to provide surround sound (e.g., front speakers, center channel speakers, surround speakers, dedicated subwoofers, in-ceiling speakers, etc.) have become commonplace. However, such audio systems often include many separate audio devices, each having acoustic drivers, that are located in distributed locations about the room in which the audio system is used. Such audio systems may also require positioning audio and/or power cabling to both convey signals representing audio to each of those audio devices and cause the acoustic output of that audio.

A prior art attempt to alleviate these shortcomings has been the introduction of a single, more capable audio device that incorporates the functionality of multiple ones of the above multitude of audio devices into one, i.e., so-called "soundbars" or "all-in-one" speakers. Unfortunately, the majority of these more capable audio devices merely co-locate the acoustic drivers of 3 or more of what are usually 5 or more audio channels (usually, the left-front, right-front and center audio channels) into a single cabinet in a manner that degrades the normally desired spatial effect meant to be achieved through the provision of multiple, separate audio devices.

SUMMARY

An audio device incorporates a first acoustic driver having a first direction of maximum acoustic radiation and a second acoustic driver having a second direction of maximum acoustic radiation, where the first and second directions of maximum acoustic radiation are not in parallel, and where the audio device employs the first acoustic driver or the second acoustic driver in acoustically outputting a sound of a predetermined range of frequencies in response to the orientation of the casing of the audio device relative to the direction of the force of gravity.

In one aspect, an audio device includes a casing rotatable about an axis between a first orientation and a second orientation different from the first orientation; an orientation input device disposed on the casing to enable determination of an orientation of the casing relative to the direction of the force of gravity; a first acoustic driver disposed on the casing and having a first direction of maximum acoustic radiation; a second acoustic driver disposed on the casing and having a second direction of maximum acoustic radiation. Also, the first direction of maximum acoustic radiation is not parallel to the second direction of maximum acoustic radiation; a sound is acoustically output by the first acoustic driver in response to the casing being in the first orientation; and the sound is acoustically output by the second acoustic driver in response to the casing being in the second orientation.

In another aspect, a method includes determining an orientation of a casing of an audio device about an axis relative to a direction of the force of gravity; acoustically outputting a sound through a first acoustic driver disposed on the casing and having a first direction of maximum acoustic radiation in response to the casing being in a first orientation about the axis; and acoustically outputting the sound through a second acoustic driver disposed on the casing and having a second direction of maximum acoustic radiation in response to the casing being in a second orientation about the axis, wherein the first and second directions of maximum acoustic radiation are not parallel.

In one aspect, an audio device includes a casing rotatable about an axis between a first orientation and a second orientation different from the first orientation; an orientation input device disposed on the casing to enable determination of an orientation of the casing relative to the direction of the force of gravity; and a plurality of acoustic drivers disposed on the casing and operable to form an acoustic interference array. Also, the plurality of acoustic drivers are operated to generate destructive interference in a first direction from the plurality of acoustic drivers in response to the casing being in the first orientation; and the plurality of acoustic drivers are operated to generate destructive interference in a second direction from the plurality of acoustic drivers in response to the casing being in the second orientation.

In another aspect, a method includes detecting an orientation of a casing of an audio device about an axis relative to a direction of the force of gravity; operating a plurality of acoustic drivers disposed on the casing to generate destructive interference in a first direction relative to the plurality of acoustic drivers in response to the casing being in a first orientation about the axis relative to the direction of the force of gravity; and operating the plurality of acoustic drivers to generate destructive interference in a second direction relative to the plurality of acoustic drivers in response to the casing being in a second orientation about the axis relative to the direction of the force of gravity.

Other features and advantages of the invention will be apparent from the description and claims that follow.

DETAILED DESCRIPTION

It is intended that what is disclosed and what is claimed herein is applicable to a wide variety of audio devices that are structured to acoustically output audio (e.g., any of a variety of types of loudspeaker, acoustic driver, etc.). It is intended that what is disclosed and what is claimed herein is applicable to a wide variety of audio devices that are structured to be coupled to such audio devices to control the manner in which they acoustically output audio (e.g., surround sound processors, pre-amplifiers, audio channel distribution amplifiers, etc.). It should be noted that although various specific embodiments of audio device are presented with some degree of detail, such presentations are intended to facilitate understanding through the use of examples, and should not be taken as limiting either the scope of disclosure or the scope of claim coverage.

Figure 1A:
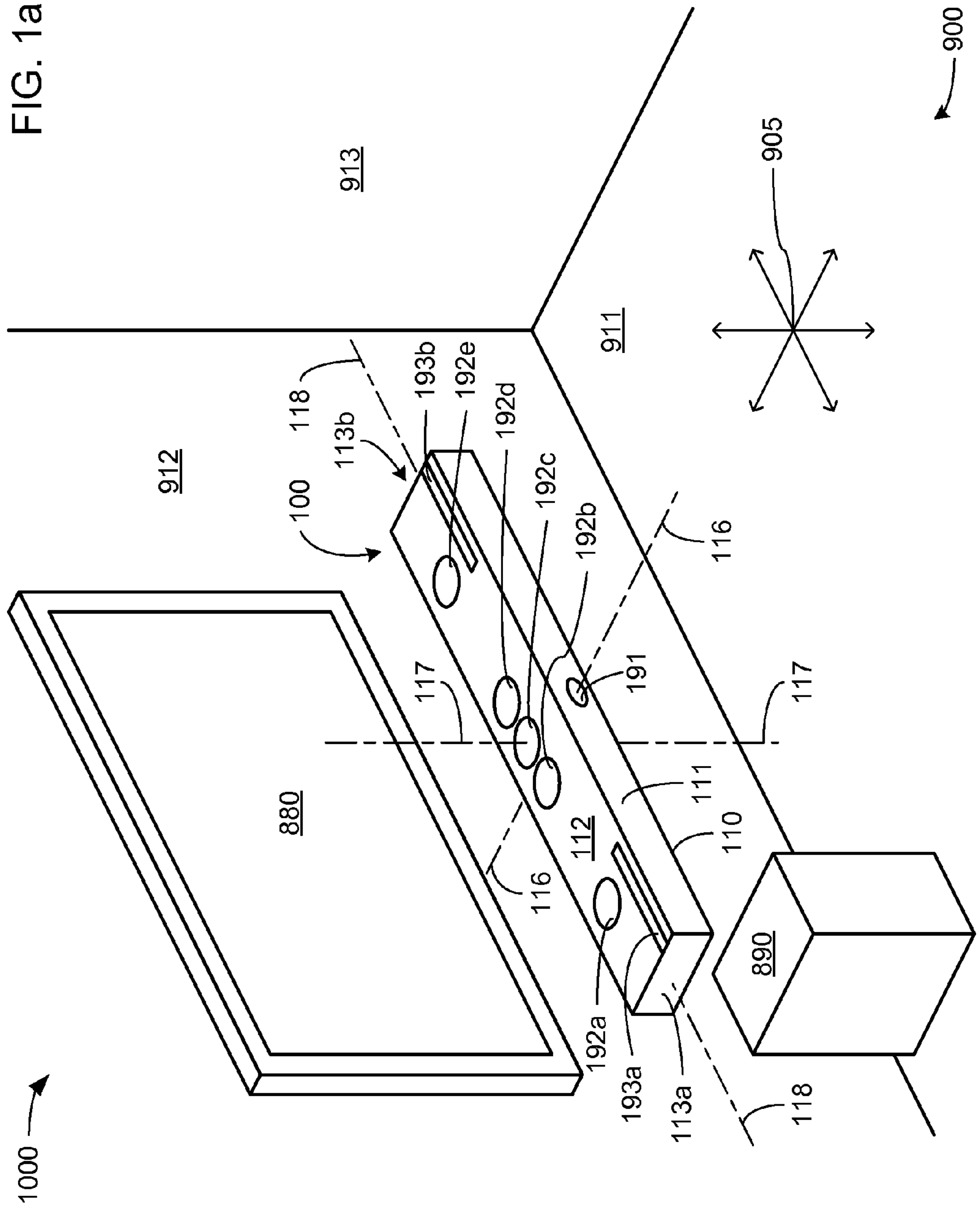
FIGS. 1*a* and 1*b* are perspective views of various possible physical orientations of one embodiment of an audio device.
Figure 1B:
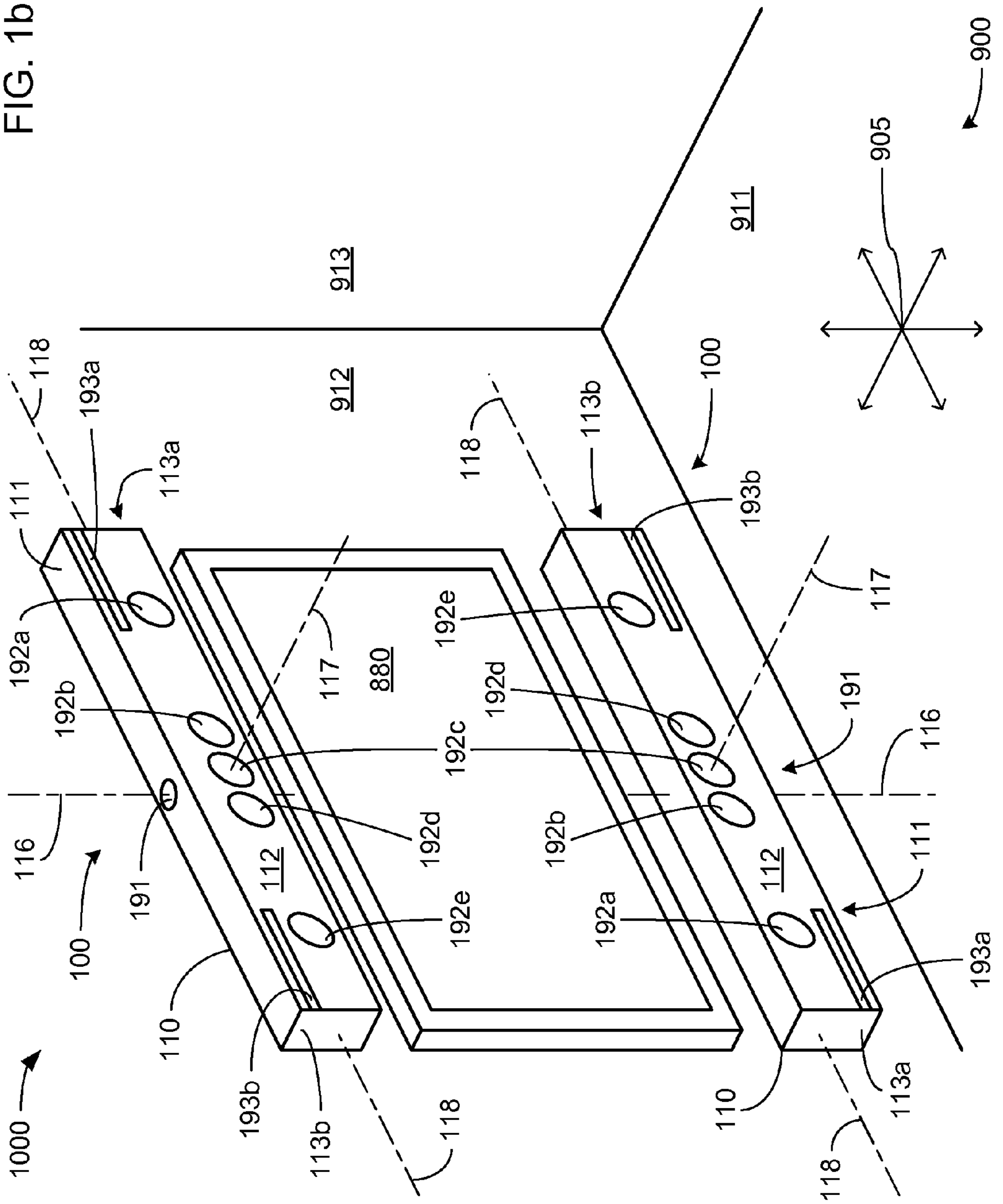

FIGS. 1*a* and 1*b* are perspective views of various possible physical orientations in which an embodiment of an audio device 100 may be positioned within a room 900 as part of an audio system 1000 (that may include a subwoofer 890 along with the audio device 100) to acoustically output multiple audio channels of a piece of audio (likely received from yet another audio device, e.g., a tuner or a disc player) about at least the one listening position 905 (in some embodiments, more than one listening position, not shown, may be accommodated). More specifically, the audio device 100 incorporates a casing 110 on which one or more of acoustic drivers 191, 192*a-e* and 193*a-b* incorporated into the audio device 100 are disposed, and the audio device 100 is depicted in FIGS. 1*a* and 1*b* with the casing 110 being oriented in various ways relative to the direction of the force of gravity, relative to a visual device 880 and relative to a listening position 905 of the room 900 to cause different ones of these acoustic drivers to acoustically output audio in various different directions relative to the listening position 905.

As further depicted, the audio device 100 may be used in conjunction with the dedicated subwoofer 890 in a manner in which a range of lower frequencies of audio are separated from audio at higher frequencies and are acoustically output by the subwoofer 890, instead of by the audio device 100 (along with any lower frequency audio channel also acoustically output by the subwoofer 890). For the sake of avoiding visual clutter, the subwoofer 890 is shown only in FIG. 1*a*, and not in FIG. 1*b*. As also further depicted, the audio device 100 may be used in conjunction with the visual device 880 (e.g., a television, a flat panel monitor, etc.) in a manner in which audio of an audio/visual program is acoustically output by the audio device 100 (perhaps also in conjunction with the subwoofer 890) while video of that same audio/visual program is simultaneously displayed by the visual device 880.

As depicted, the casing 110 of the audio device 100 has at least a face 111 through which the acoustic driver 191 acoustically outputs audio; a face 112 through which the acoustic drivers 192*a-e* and 193*a-b* acoustically output audio; and at least two ends 113*a* and 113*b*. The casing 110 has an elongate shape that is intended to allow these acoustic drivers to be placed in a generally horizontal elongate pattern that extends laterally relative to the listening position 905, resulting in acoustic output of audio with a relatively wide horizontal spatial effect extending across an area deemed to be "in front of" a listener at the listening position 905. Despite this specific depiction of the casing 110 having a box-like or otherwise rectangular shape, it is to be understood that the casing 110 may have any of a variety of shapes, at least partially dictated by the relative positions of its acoustic drivers, including and not limited to rounded, curving, sheet-like and tube-like shapes.

As also depicted, an axis 118 extends along the elongate dimension of the casing 110 (i.e., along a line extending from the end 113*a* to the end 113*b*). Thus, in all three of the depicted physical orientations of the casing 110 in FIGS. 1*a* and 1*b*, the line followed by the axis 118 extends laterally relative to a listener at the listening position 905, and in so doing, extends across what is generally deemed to be "in front of" that listener. As will also be explained in greater detail, the axis 117 extends perpendicularly through the axis 118, perpendicularly through the face 112, and through the center of the acoustic driver 192*c;* and the axis 116 also extends perpendicularly through the axis 118, perpendicularly through the face 111, and through the center of the acoustic driver 191. As will further be explained in greater detail, in this embodiment of the audio device 100 depicted in FIGS. 1*a* and 1*b*, with the casing 110 being of the depicted box-like shape with the faces 111 and 112 meeting at a right angle, the axes 116 and 117 happen to be perpendicular to each other.

With the axis 118 extending along the elongate dimension of the casing 110 such that the axis 118 follows the line along which the acoustic drivers 191, 192*a-e* and 193*a-b* are positioned (i.e., is at least parallel to such a line, if not coincident with it), and with it being envisioned that the casing 110 is to be physically oriented to arrange these acoustic drivers generally along a line extending laterally relative to the listening position 905, the axis 118 is caused to extend laterally relative to the listening position 905 in all of the physical orientations depicted in FIGS. 1*a* and 1*b* (and would, therefore, extend laterally relative to at some other listening positions at least in the vicinity of the listening position 905, as the listening position 905 is meant to be an example listening position, and not necessarily the only listening position). Although it is certainly possible for the casing 110 to be physically oriented to extend in a manner that would cause the axis 118 to extend in any entirely different direction relative to the listening position 905 (e.g., vertically in parallel with the direction of the force of gravity), the fact that the pair of human ears are arranged laterally relative to each other on the human head (i.e., arranged such that there is a left ear and a right ear) provides impetus to tend to physically orient the casing 110 in a manner that results in the acoustic drivers 191, 192*a-e* and 193*a-b* being arranged in a generally lateral manner relative to the listening position 905 such that the axis 118 also follows that same lateral orientation.

FIG. 1*a* depicts the casing 110 of the audio device 100 being oriented relative to the force of gravity and the listening position 905 such that the face 112 faces generally upwards towards a ceiling (not shown) of the room 900; such that the face 111 faces towards at least the vicinity of the listening position 905; and such that the ends 113*a* and 113*b* extend laterally sideways relative to the listening position 905 and relative to the direction of the force of gravity. More specifically, the casing 110 is depicted as being elevated above a floor 911 of the room 900, extending along a wall 912 of the room 900 (to which the visual device 880 is depicted as being mounted), with the end 113*b* extending towards another wall 913 of the room 900, and with the end 113*a* being positioned in the vicinity of the subwoofer 890 (however, the actual position of any one part of the casing 110 relative to the subwoofer 890 is not of importance, and what is depicted is only but an example). Thus, in this position, the axis 118 extends parallel to the wall 912 and towards the wall 913; the axis 117 extends parallel to the wall 912 and towards both the floor 911 and a ceiling; and the axis 116 extends outward from the wall 912 and towards the vicinity of the listening position 905. It is envisioned that the casing 110 may be mounted to the wall 912 in this position, or that the casing 110 may be set in this position atop a table (not shown) atop which the visual device 880 may also be placed. It should be noted that despite this specific depiction of the casing 110 of the audio device 100 being positioned along the wall 912 in this manner, such positioning along a wall is not necessarily required for proper operation of the audio device 100 in acoustically outputting audio (i.e., the audio device 100 could be positioned well away from any wall), and so this should not be deemed as limiting what is disclosed or what is claimed herein to having placement along a wall.

FIG. 1*b* depicts the casing 110 in two different possible orientations as alternatives to the orientation depicted in FIG. 1*a* (in other words, FIG. 1*b* is not attempting to depict two of the audio devices 100 in use simultaneously with one above and one below the visual device 880). In one of these orientations, the casing 110 of the audio device 100 is oriented relative to the direction of the force of gravity, the visual device 880 and the listening position 905 such that the casing is positioned below the visual device 880; such that the face 111 faces generally downwards towards the floor 911; such that the face 112 faces towards at least the vicinity of the listening position 905; and such that the ends 113*a* and 113*b* extend laterally sideways relative to the listening position 905 and relative to the direction of the force of gravity, with the end 113*b* extending towards the wall 913. In the other of these orientations, the casing 110 of the audio device 100 is oriented relative to the direction of the force of gravity, the visual device 880 and the listening position 905 such that the casing is positioned above the visual device 880; such that the face 111 faces generally upwards towards a ceiling (not shown) of the room 900; such that the face 112 faces towards at least the vicinity of the listening position 905; and such that the ends 113*a* and 113*b* extend laterally sideways relative to the listening position 905 and relative to the direction of the force of gravity, with the end 113*a* extending towards the wall 913. In changing the orientation of the casing 110 from what was depicted in FIG. 1*a* to the one of the physical orientations depicted in FIG. 1*b* as being under the visual device 880 and closer to the floor 911, the casing 110 is rotated 90 degrees about the axis 118 (in what could be informally described as a "log roll") such that the face 111 is rotated downwards to face the floor 911, and the face 112 is rotated away from facing upwards to face towards the listening position 905. With the casing 110 thus oriented in this one depicted position of FIG. 1*b* that is under the visual device 880, the axis 118 continues to extend laterally relative to the listening position 905, but the axis 117 now extends towards and away from at least the vicinity of the listening position 905, and the axis 116 now extends vertically in parallel with the direction of the force of gravity (and parallel to the wall 912). In changing the orientation of the casing 110 from the one of the physical orientations in FIG. 1*b* that is under the visual device 880 to the other the physical orientations in FIG. 1*b* that is above the visual device 880, the casing 110 is rotated 180 degrees about the axis 117 (in what could be informally described as a an "end-over-end" rotation) such that the face 111 is rotated from facing downwards to facing upwards, while the face 112 continues to face towards the listening position 905. With the casing 110 thus oriented in this other depicted position of FIG. 1*b* that is above the visual device 880, the axis 118 again continues to extend laterally relative to the listening position 905, the axis 117 continues to extend towards and away from at least the vicinity of the listening position 905, and the axis 116 continues to extend vertically in parallel with the direction of the force of gravity (and parallel to the wall 912). It is envisioned that the casing 110 may be mounted to the wall 912 in either of these two positions, or that the casing 110 may be mounted to a stand to which the visual device 880 is also mounted (possibly away from any wall).

It should also be noted that the casing 110 may be positioned above the visual device 880 in a manner that does not include making the "end-over-end" rotation about the axis 117 in changing from the position under the visual device 880. In other words, it should be noted that an alternate orientation is possible at the position above the visual device 880 in which the face 111 faces downward towards the floor 911, instead of upwards towards a ceiling. Whether to perform such an "end-over-end" rotation about the axis 117, or not, may depend on what accommodations are incorporated into the design of the casing 110 for power and/or signal cabling to enable operation of the audio device 100—in other words, such an "end-over-end" rotation about the axis 117 may be necessitated by the manner in which cabling emerges from the casing 110. Alternatively and/or additionally, such "end-over-end" rotation about the axis 117 may be necessitated (or at least deemed desirable) to accommodate orienting the acoustic driver 191 towards one or the other of the floor 911 or a ceiling to achieve a desired quality of acoustic output—however, as will be explained in greater detail, the acoustic driver 191 may be automatically disabled at times when the casing 110 is physically oriented such that a direction of maximum acoustic radiation of the acoustic driver 191 is not directed sufficiently towards the listening position 905 (or not directed sufficiently towards any listening position) such that use of the acoustic driver 191 is deemed to be undesirable.

Figure 2:
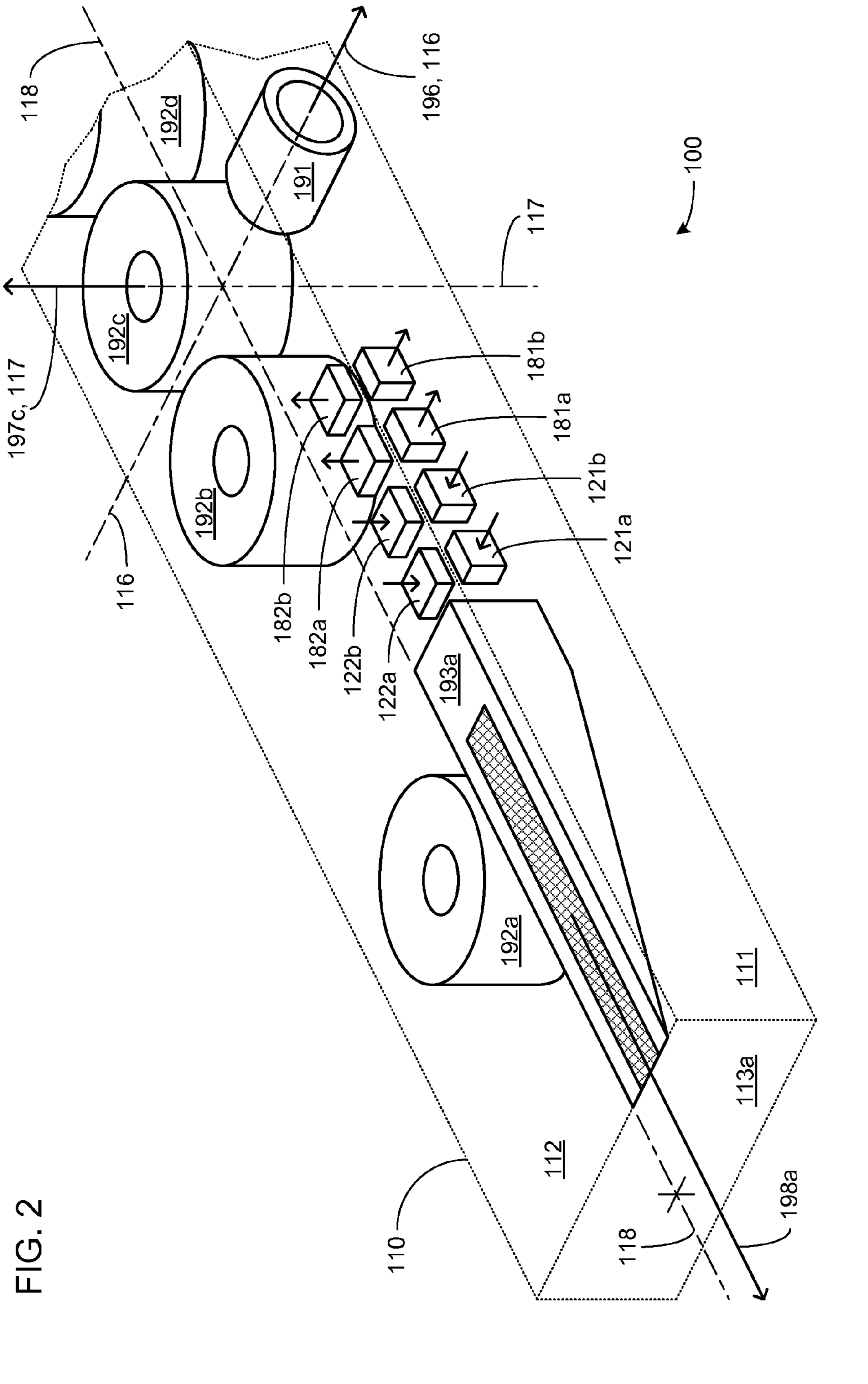
FIG. 2 is a closer perspective view of a portion of the audio device of FIGS. 1*a-b*.

FIG. 2 is a closer perspective view of a portion of the audio device 100 that includes portions of the faces 111 and 112, the end 113*a*, the acoustic drivers 191, 192*a-e* and 193*a-b*. In this perspective view, the depicted portion of the casing 110 is drawn with dotted lines (as if the casing 110 were transparent) with all other depicted components being drawn with solid lines so as to provide a view of the relative positions of components within this depicted portion of the casing 110. As also depicted in FIG. 2, the audio device 100 also incorporates infrared (IR) sensors 121*a-b* and 122*a-b*, and visual indicators 181*a-b* and 182*a-b*. As will be explained in greater detail, different ones of these IR receivers and these visual indicators are automatically selected for use depending on the physical orientation of the casing 110 of the audio device 100 relative to the direction of the force of gravity.

The acoustic driver 191 is structured to be optimal at acoustically outputting higher frequency sounds that are within the range of frequencies of sounds generally found to be within the limits of human hearing, and is thus commonly referred to as a tweeter. As depicted, the acoustic driver 191 is disposed on the casing 110 such that its direction of maximum acoustic radiation (indicated by an arrow 196) is perpendicular to the face 111. For purposes of facilitating further discussion, this direction of maximum acoustic radiation 196 is employed to define the position and orientation of the axis 116, such that the axis 116 is coincident with the direction of maximum acoustic radiation 196. Thus, when the casing 110 is positioned as depicted in FIG. 1*a*, the direction of maximum acoustic radiation 196 is directed perpendicular to the direction of the force of gravity and towards the listening position 905; and when the casing 110 is positioned in either of the physical orientations depicted in FIG. 1*b*, the direction of maximum acoustic radiation 196 is directed in parallel to the direction of the force of gravity either towards the floor 191 (in one of the depicted physical orientations) or towards a ceiling of the room 900 (in the other of the depicted physical orientations).

Each of the acoustic drivers 192*a-e* is structured to be optimal at acoustically outputting a broader range of frequencies of sounds that are more towards the middle of the range of frequencies of sounds generally found to be within the limits of human hearing, and are thus commonly referred to as a mid-range drivers. As depicted, each of the acoustic drivers 192*a-e* is disposed on the casing 110 such that their directions of maximum acoustic radiation (specifically indicated as examples for the acoustic drivers 192*a* through 192*c* by arrow 197*a* through 197*c*, respectively) is perpendicular to the face 112. For purposes of facilitating further discussion, the direction of maximum acoustic radiation 197*c* of the acoustic driver 192*c* is employed to define the position and orientation of the axis 117, such that the axis 117 is coincident with the direction of maximum acoustic radiation 197*c*. Thus, when the casing 110 is positioned as depicted in FIG. 1*a*, the direction of maximum acoustic radiation 197*c* is directed in parallel to the direction of the force of gravity and towards a ceiling of the room 900; and when the casing 110 is positioned in either of the physical orientations depicted in FIG. 1*b*, the direction of maximum acoustic radiation 197*c* is directed perpendicular to the direction of the force of gravity and towards the listening position 905.

For purposes of facilitating further discussion, the axis 118 is defined as extending in a direction where it is intersected by and perpendicular to each of the axes 116 and 117. As has been discussed and depicted in FIGS. 1*a-b* and 2, the casing 110 is of a generally box-like shape with at least the faces 111 and 112 meeting at a right angle, and with the acoustic drivers 191 and 192*a-e* each oriented such that their directions of maximum acoustic radiation 196 and 197 extend perpendicularly through the faces 111 and 112, respectively. Further, as has been depicted in FIGS. 1*a-b* and 2 (though not specifically stated), each of the acoustic drivers 191 and 192*c* are generally centered along the elongate length of the casing 110. Thus, as a result, in the embodiment of the audio device 100 depicted in FIGS. 1*a-b* and 2, the axes 116 and 117 both intersect the axis 118 at the same point and are perpendicular to each other such that all three of the axes 116, 117 and 118 are perpendicular to each other. However, it is important to note that other embodiments of the audio device 100 are possible in which the geometric relationships between the axes 116, 117 and 118 are somewhat different. For example, alternate embodiments are possible in which one or both of the acoustic drivers 191 and 192*c* are not centered along the elongate length of the casing 110 such that the axes 116 and 117 may not intersect the axis 118 at the same point along the length of the axis 118. Also for example, alternate embodiments are possible in which the acoustic drivers 191 and 192*c* are positioned relative to each other such that their directions of maximum acoustic radiation 196 and 197*c* are not perpendicular to each other such that the axes 116 and 117, respectively, are not perpendicular to each other. As a result, in such alternate embodiments, rotating the casing 110 such that one of the axes 116 or 117 extends perpendicular to the direction of the force of gravity and towards at least the vicinity of the listening position 905 may result in the other one of the axes 116 or 117 extending in a direction that is generally vertical (i.e., more vertical than horizontal), but not truly parallel to the direction of the force of gravity.

Indeed, it may be deemed desirable in such alternate embodiments to have neither of the axes 116 or 117 extending truly perpendicular or parallel to the direction of the force of gravity such that one of these axes extends at a slight upward or downward angle towards the listening position 905 (i.e., in a direction that is still more horizontal than vertical) while the other one of these axes extends at a slight angle relative to the direction of the force of gravity that leans slightly towards the listening position 905 (i.e., in a direction that is still more vertical than horizontal, but angled out of vertical in a manner that is towards the listening position 905). This may be done in recognition of the tendency for a listener at the listening position 905 to position themselves such that their eyes are at about the same level as the center of the viewable area of the visual device 880 such that the audio device 100 being positioned above or below the visual device 880 will result in the acoustic drivers of the audio device 100 being positioned at a level that is above or below the level of the ears of that listener. Angling the direction of maximum acoustic radiation for one or more of the acoustic drivers 191 or 192*a-e* slightly upwards or downwards so as to be better "aimed" at the level of the ears of that listener may be deemed desirable.

Each of the acoustic drivers 193*a* and 193*b* is structured to be optimal at acoustically outputting higher frequency sounds that are within the range of frequencies of sounds generally found to be within the limits of human hearing. The acoustic drivers 193*a* and 193*b* are each of a far newer design than the long familiar designs of typical tweeters and mid-range drivers (such as the acoustic drivers 191 and 192*a-e*, respectively), and are the subject of various pending patent applications, including U.S. Published Patent Applications 2009-0274329 and 2011-0026744, which are incorporated herein by reference. As depicted, each of the acoustic drivers 193*a* and 193*b* is disposed on the casing 110 with an opening from which acoustic output is emitted (i.e., from which its acoustic output radiates) positioned on the face 112 (and covered in mesh, fabric or a perforated sheet). The direction of maximum acoustic radiation (indicated for the acoustic driver 193*a* by an arrow 198*a*, as an example) is almost (but not quite) parallel to the plane of this emissive opening such that each of the acoustic drivers 193*a* and 193*b* could fairly be described as radiating much of their acoustic output in a substantially "sideways" direction relative to this emissive opening (there is a slight angling of this direction away from the plane of this emissive opening). As a result, the direction of maximum acoustic radiation 198*a* is almost parallel to the face 112 (i.e., with that same slight angle away from the face 112) and extends almost parallel the axis 118. Thus, when the casing 110 is positioned as depicted in FIG. 1*a*, the directions of maximum acoustic radiation of the acoustic drivers 193*a* and 193*b* are directed not quite perpendicular to the direction of the force of gravity (i.e., with a slight angle upwards relative to the direction of the force of gravity) and laterally relative to the listening position 905 (with the direction of maximum acoustic radiation of the acoustic driver 193*b* directed towards the wall 913). And, when the casing 110 is positioned in either of the physical orientations depicted in FIG. 1*b*, the directions of maximum acoustic radiation of the acoustic drivers 193*a* and 193*b* are directed perpendicular to the direction of the force of gravity and still laterally relative to the listening position 905 (but not perfectly laterally as there is a slight angle towards the listening position 905), with the direction of maximum acoustic radiation 198*a* of the acoustic driver 193*a* being directed towards the wall 913 in one of the depicted positions, and with the direction of maximum acoustic radiation 198*a* of the acoustic driver 193*a* directed away from the wall 913 in the other of the depicted positions.

As also depicted in FIG. 2, the IR sensors 121*a* and 121*b* are disposed on the face 111 in a manner that is optimal for receiving IR signals representing commands from a remote control or other device (not shown) by which operation of the audio device 100 may be controlled that is located in the vicinity of the listening position 905 when the casing 110 is physically oriented as depicted in FIG. 1*a*; and the IR sensors 122*a* and 122*b* are disposed on the face 112 in a manner that is optimal for receiving such IR signals when the casing 110 is physically oriented in either of the two ways depicted in FIG. 1*b*. Similarly, the visual indicators 181*a* and 181*b* are disposed on the face 111 in a manner that is optimal for being seen by a person in the vicinity of the listening position 905 when the casing 110 is physically oriented as depicted in FIG.

1*a*; and the visual indicators 182*a* and 182*b* are disposed on the face 112 in a manner that is optimal for being seen from the vicinity of the listening position 905 when the casing 110 is physically oriented in either of the two ways depicted in FIG. 1*b*.

Figure 3A:
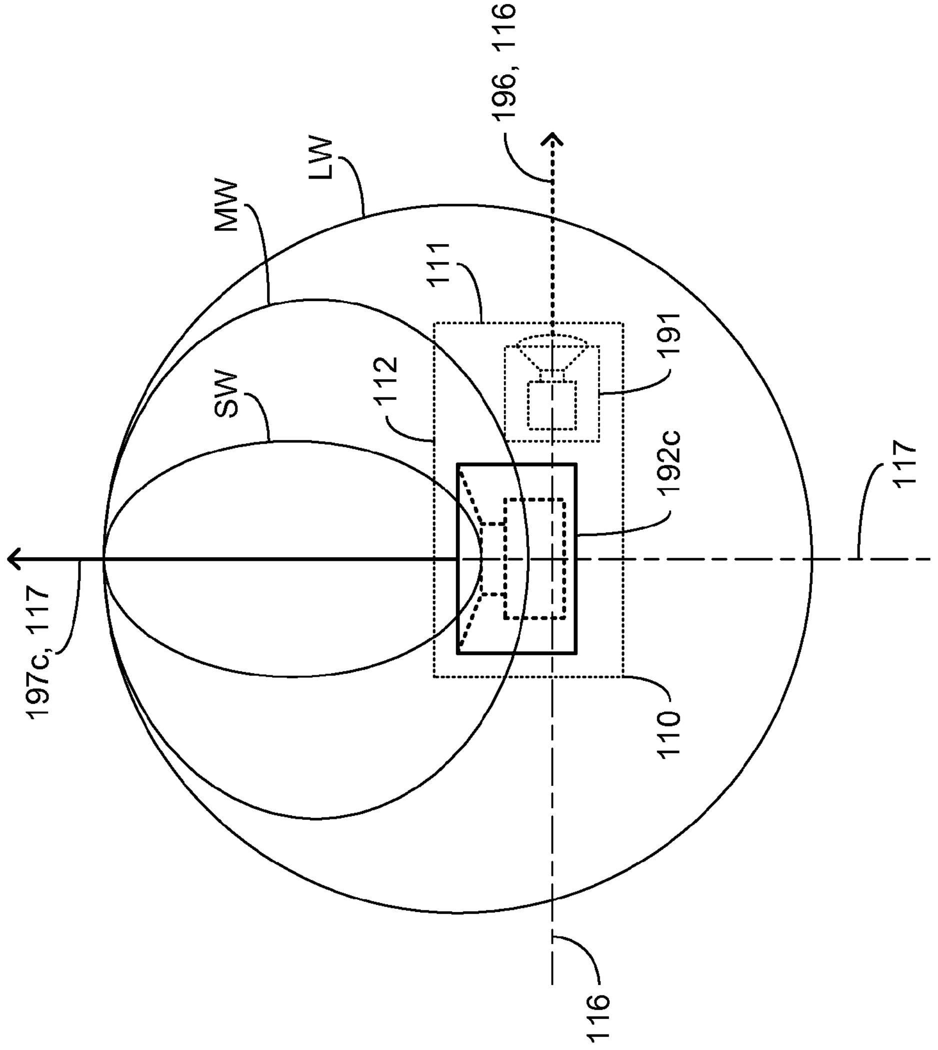
FIG. 3*a* is a directivity plot of an acoustic driver of the audio device of FIGS. 1*a-b*.

FIG. 3*a* is an approximate directivity plot of the pattern of acoustic radiation of the acoustic driver 192*c* such as will be familiar to those skilled in the art of acoustics, though the customary depiction of degrees of angles from a direction of maximum acoustic radiation have been omitted to avoid visual clutter in this discussion. Instead, FIG. 3*a* depicts the geometric relationship in the placement of the acoustic driver 191 relative to the acoustic driver 192*c*, and the geometric relationship between the axes 116 and 117 (as well as between the directions of maximum acoustic radiation 196 and 197*c*) as seen from the end 113*a* such that the axis 118 extends out from the page at the intersection of the axes 116 and 117. As can be seen, given the relative placement of the acoustic drivers 191 and 192*c* within the casing 110, the axes 116 and 117 happen to intersect within the acoustic driver 192*c*, and given the manner in which the position and orientation of the axis 118 is defined (i.e., at a position and in an orientation at which the axis 118 can be intersected at right angles by each of the axes 116 and 117), it can be seen that the axis 118 actually extends through all of the acoustic drivers 192*a-e* in this depicted embodiment—it should be noted that other embodiments are possible in which the axis 118 may not extend through any acoustic driver.

As is well known to those skilled in the art of acoustics, the pattern of acoustic radiation of a typical acoustic driver changes greatly depending on the frequency of the sound being acoustically output. Sounds having a wavelength that is substantially longer than the size of the diaphragm of an acoustic driver generally radiate in a substantially omnidirectional pattern from that acoustic driver with not quite equal strength in all directions from that acoustic driver (depicted as example pattern LW). Sounds having a wavelength that is within an order of magnitude of the size of that diaphragm generally radiate much more in the same direction as the direction of maximum acoustic radiation of that driver than in the opposite direction, but spreading widely from that direction of maximum acoustic radiation (depicted as example pattern MW). Sounds having a wavelength that is substantially shorter than the size of that diaphragm generally also radiate much more in the same direction as that direction of maximum acoustic radiation, but spreading far more narrowly (depicted as example pattern SW).

As a result of these frequency-dependent patterns of acoustic radiation, and as depicted in FIG. 3*a*, such longer wavelength sounds as acoustically output by the acoustic driver 192*c* radiate with almost equal acoustic energy both in the direction of maximum acoustic radiation 197*c* of the acoustic driver 192*c* and in the direction of maximum acoustic radiation 196 of the acoustic driver 191; sounds with a wavelength more comparable to the size of the diaphragm of the acoustic driver 192*c* also radiate in the direction of maximum acoustic radiation 196, but with considerably less acoustic energy than in the direction of maximum acoustic radiation 197*c*; and such shorter wavelength sounds acoustically output by the acoustic driver 192*c* radiate largely in the direction of maximum acoustic radiation 197*c*, while radiating even less in the direction of maximum acoustic radiation 196.

Figure 3B:
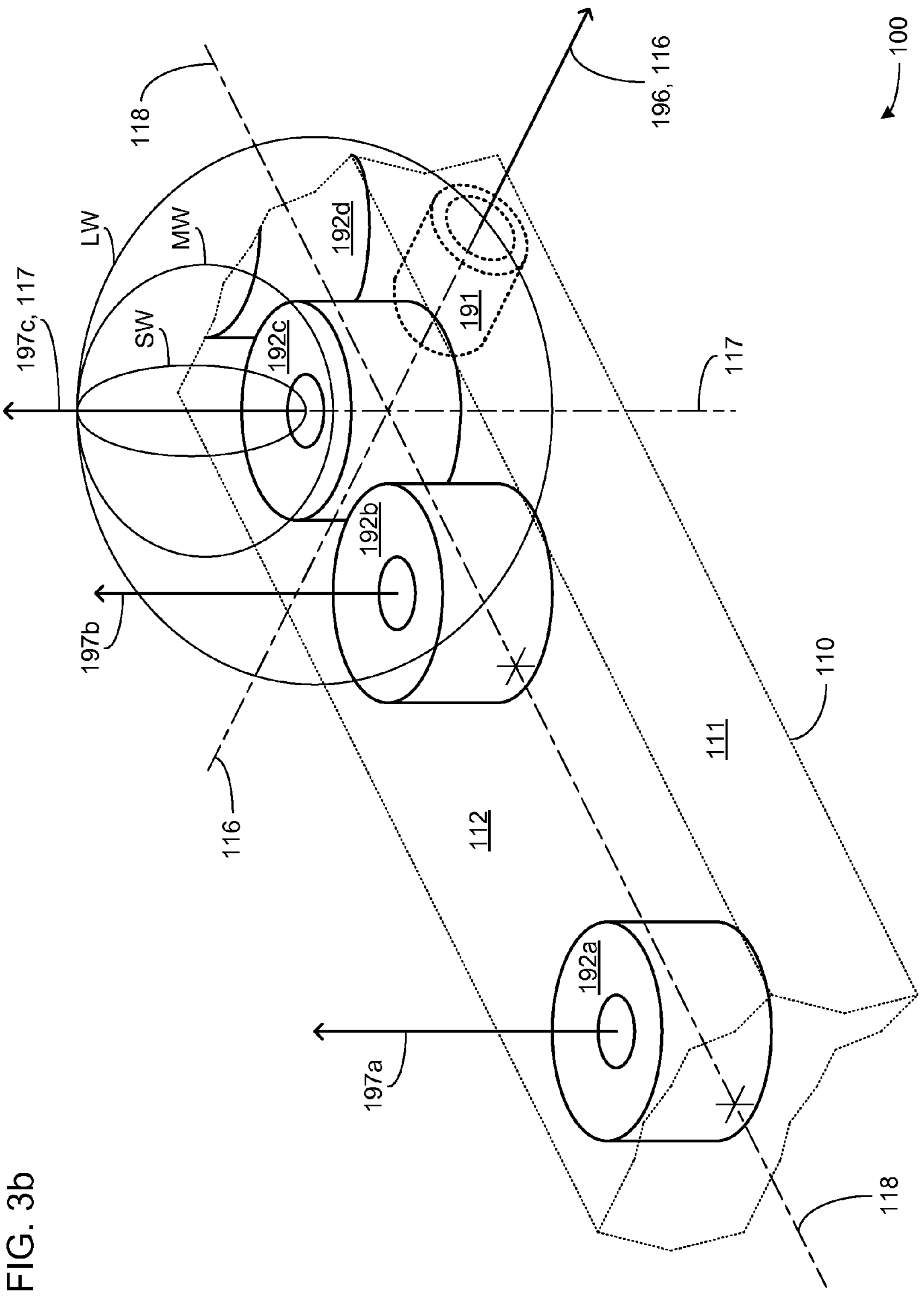
FIG. 3*b* is a closer perspective view of a subpart of the portion of FIG. 2 combined with the directivity plot of FIG. 3*a*.

FIG. 3*b* is a closer perspective view of a subpart of the portion of the audio device 100 depicted in FIG. 2, with several components omitted for sake of visual clarity, including the acoustic driver 193*a* and all of the IR sensors and visual indicators. The acoustic driver 191 is drawn with dotted lines only as a guide to the path of the axis 116 and the direction of maximum acoustic radiation 196, and the depicted portion of the casing 110 is also drawn with dotted lines for the sake of visual clarity. The approximate directivity plot of the pattern of acoustic radiation of the acoustic driver 192*c* first depicted in FIG. 3*a* is superimposed over the location of the acoustic driver 192*c* in FIG. 3*b*.

This superimposition of the approximate directivity pattern of FIG. 3*a* makes more apparent how the longer wavelength sounds and the sounds having a wavelength within an order of magnitude of the size of the diaphragm of the acoustic driver 192*c* radiate into areas shared by the patterns of acoustic radiation of at least the adjacent acoustic drivers, including the specifically depicted acoustic drivers 191, 192*b* and 192*c*. In contrast, shorter wavelength sounds radiating from the acoustic driver 192*c* must radiate a considerable distance along the direction of maximum acoustic radiation 197*c* before their more gradual spread outward from the direction of maximum acoustic radiation 197*c* causes them to enter into the area of the pattern of acoustic radiation for similar sounds radiating from an adjacent acoustic driver, such as the acoustic driver 192*b* (from which such similar sounds would gradually spread as they radiate along the direction of maximum acoustic radiation 197*b*).

The acoustic drivers 192*a-e* are operated in a manner that creates one or more acoustic interference arrays. Acoustic interference arrays are formed by driving multiple acoustic drivers with signals representing portions of audio that are derived from a common piece of audio, with each of the derived audio portions differing from each other through the imposition of differing delays and/or differing low-pass, high-pass or band-pass filtering (and/or other more complex filtering) that causes the acoustic output of each of the acoustic drivers to at least destructively interfere with each other in a manner calculated to at least attenuate the audio heard from the multiple acoustic drivers in at least one direction while possibly also constructively interfering with each other in a manner calculated to amplify the audio heard from those acoustic drivers in at least one other direction. Numerous details of the basics of implementation and possible use of such acoustic interference arrays are the subject of issued U.S. Pat. Nos. 5,870,484 and 5,809,153, as well as the aforementioned US Published Patent Applications, all of which are incorporated herein by reference. For sake of clarity, it should be noted that causing the acoustic output of multiple acoustic drivers to destructively interfere in a given direction should not be taken to mean that the destructive interference is a complete destructive interference such that all acoustic output of those multiple drivers radiating in that given direction is fully attenuated to nothing—indeed, it should be understood that, more likely, some degree of attenuation short of "complete destruction" of acoustic radiation in that given direction is more likely to be achieved.

More specifically, combinations of the acoustic drivers 192*a-e* are operated to implement a left audio acoustic interference array, a center audio acoustic interference array, and a right audio acoustic interference array. The left and right audio acoustic interference arrays are configured with delays and filtering that directs left audio channel(s) and right audio channel(s), respectively, towards opposite lateral directions that generally follow the path of the axis 118. The center audio acoustic interference array is configured with delays and filtering that directs a center audio channel towards the vicinity of listening position 905, generally following the path of whichever one of the axes 116 or 117 is more closely directed at the listening position 905. To do this, these configurations of delays and/or filtering must take into account the physical orientation of the audio device 100, given that the audio device 100 is meant to be usable in more than one orientation.

With the casing 110 physically oriented as depicted in FIG. 1*a* such that the directions of maximum acoustic radiation of each the acoustic drivers 192*a-e* (including directions of maximum acoustic radiation 197*a-c*) are directed upward so as to be substantially parallel to the direction of the force of gravity, and therefore, not towards the listening position 905, these acoustic interference arrays must be configured with delays and filtering that direct their respective audio channels in opposing directions along the axis 118 and towards the listening position 905 along the axis 116. More specifically, the left and right audio acoustic interference arrays must be configured to at least cause destructive interference to occur to attenuate the acoustic energy with which their respective sounds radiate at least along the axis 116 in the direction of the listening position 905, while preferably also causing constructive interference to occur to increase the acoustic energy with which their respective sounds radiate in their respective directions along the axis 118. In this way, the sounds of the left audio channel(s) and the right audio channel(s) are caused to be heard by a listener at the listening position 905 (and presumably facing the audio device 100) with greater acoustic energy from that listener's left and right sides than from directly in front of that listener to provide a greater spatial effect, laterally. The center audio acoustic interference array must be configured to at least cause destructive interference to occur to attenuate the acoustic energy with which its sounds radiate at least in either direction along the axis 118, while preferably also causing constructive interference to occur to increase the acoustic energy with its sounds radiate along the axis 116 in the direction of the listening position 905. In this way, the sounds of the center audio channel are caused to be heard by a listener at the listening position 905 with greater acoustic energy from a direction directly in front of that listener than from either their left or right side (presuming that listener is facing the audio device 100).

With the casing 110 in either of the physical orientations depicted in FIG. 1*b* such that the directions of maximum acoustic radiation of each the acoustic drivers 192*a-e* (including the directions of maximum acoustic radiation 197*a-c*) are directed towards the listening position 905 (and generally perpendicular to the direction of the force of gravity), these acoustic interference arrays must be configured with different delays and filtering to enable them to continue to direct their respective audio channels in opposing directions along the axis 118 and towards the listening position 905 (this time along the axis 117, and not along the axis 116).

Now, the left and right audio acoustic interference arrays must be configured to at least cause destructive interference to occur to attenuate the acoustic energy with which their respective sounds radiate at least along the axis 117 in the direction of the listening position 905 (instead of along the axis 116), while preferably also again causing constructive interference to occur to increase the acoustic energy with which their respective sounds radiate in their respective directions along the axis 118. Correspondingly, the center audio acoustic interference array must still be configured to at least cause destructive interference to occur to attenuate the acoustic energy with which its sounds radiate at least in either direction along the axis 118, but now while also preferably causing constructive interference to occur to increase the acoustic energy with its sounds radiate along the axis 117 (instead of along the axis 116) in the direction of the listening position 905.

Figure 4A:
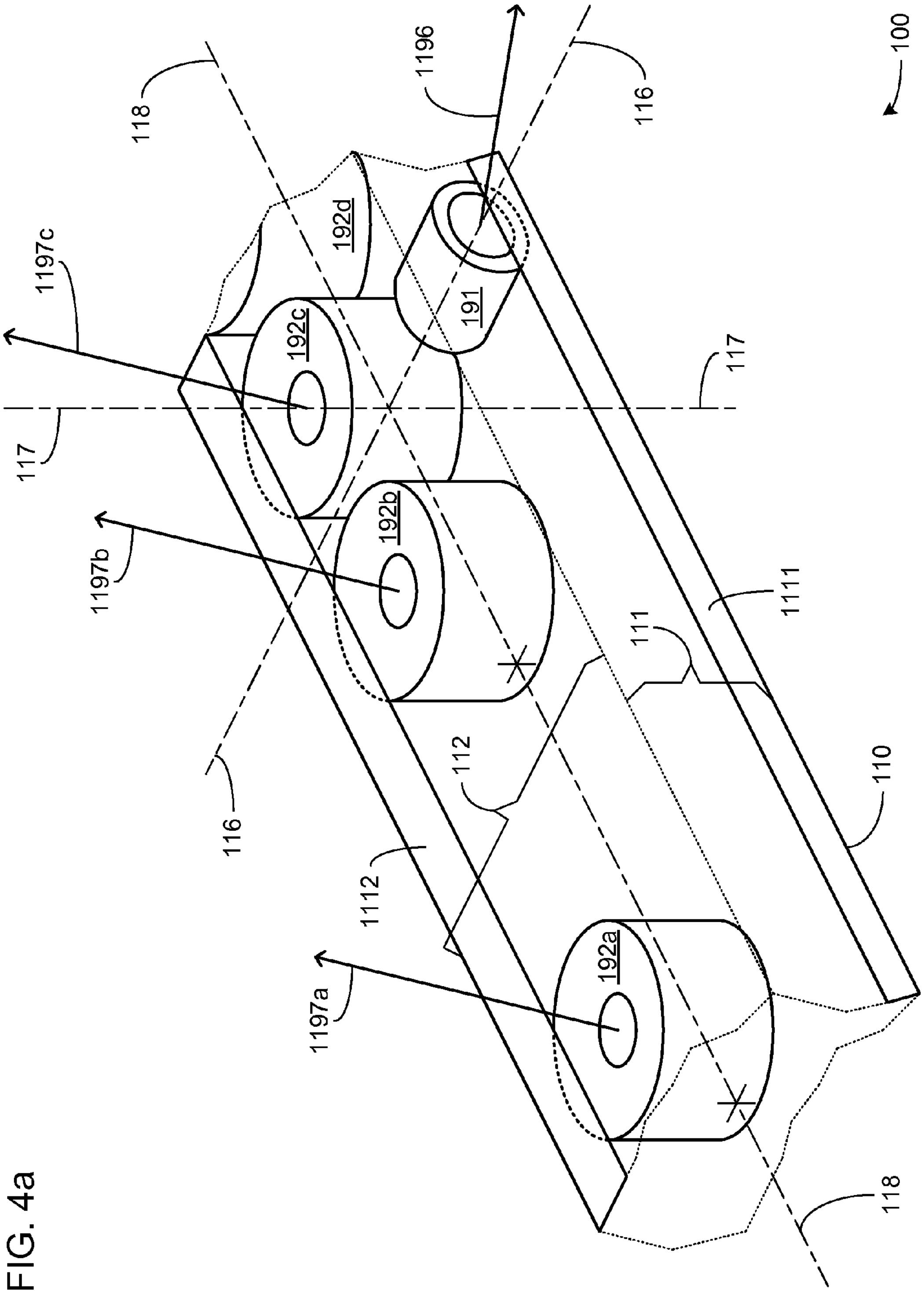
FIGS. 4*a* and 4*b* are closer perspective views, similar to FIG. 3*b*, of alternate variants of the audio device of FIGS. 1*a* and 1*b*.
Figure 4B:
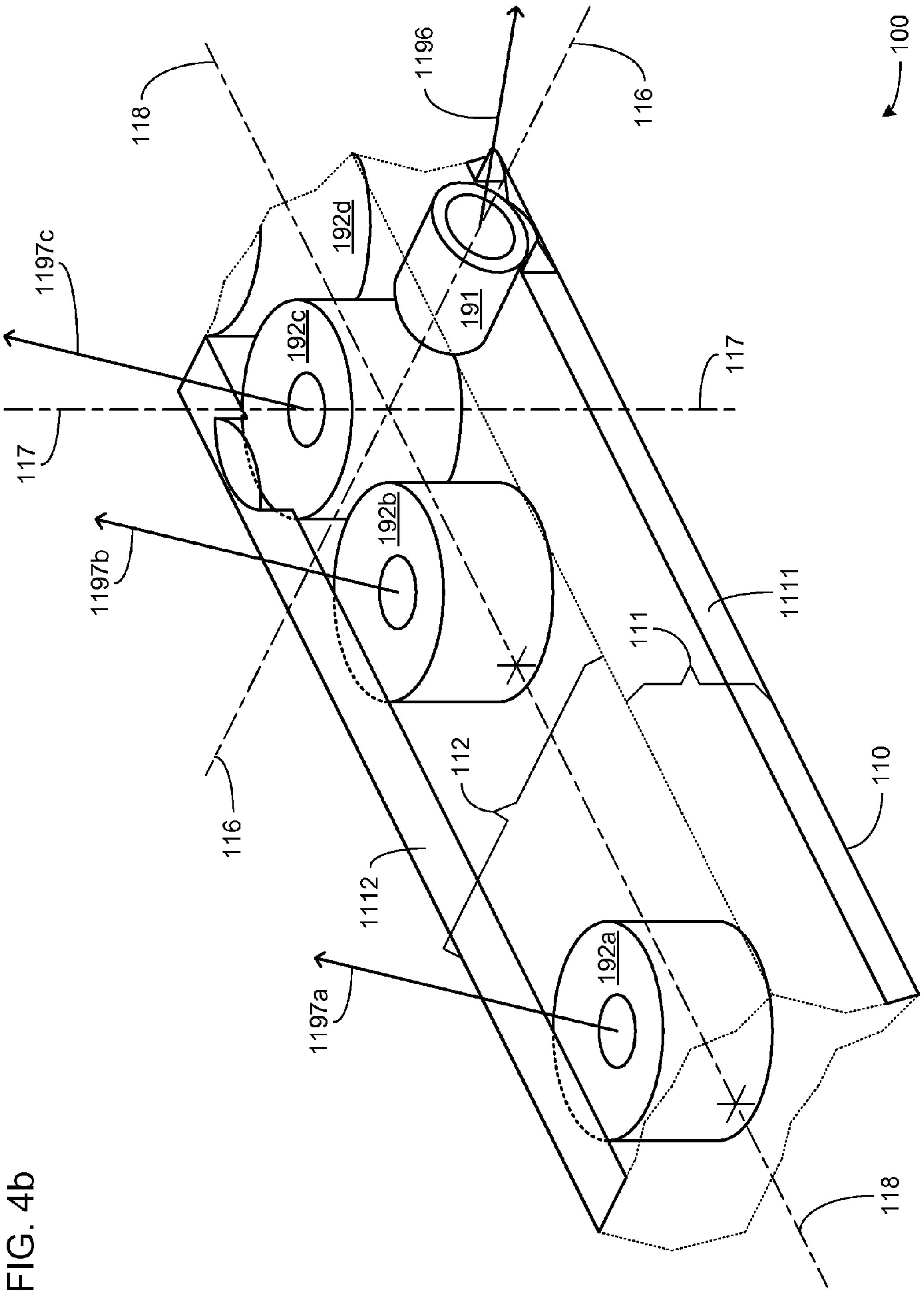

FIGS. 4*a* and 4*b* are closer perspective views of a subpart of alternate variants of the audio device 100 (with several components omitted for sake of visual clarity in a manner similar to FIG. 3*b*) depicting aspects of the acoustic effect of adding various forms of acoustic reflector 1111 and/or 1112. In FIG. 4*a*, the acoustic reflectors 1111 and 1112 take the form of generally flat strips of material that partially overlie the diaphragms of the acoustic drivers 191 and 192*a-c*, respectively. In FIG. 4*b*, the acoustic reflectors 1111 and 1112 have somewhat more complex shapes selected to more precisely reflect at least selected sounds of predetermined ranges of frequencies.

As depicted in both FIGS. 4*a* and 4*b*, the effect of the addition of the acoustic reflectors 1111 and 1112 is to effectively bend the directions of maximum acoustic radiation 196 and 197*a-c* (referring back to FIG. 3*b*) to create corresponding effective directions of maximum acoustic radiation 1196 and 1197*a-c*, respectively, for at least a subset of the range of audio frequencies that the acoustic drivers 191 and 192*a-c*, respectively, may be employed to acoustically output. As will be apparent to those skilled in the art, longer wavelength sounds are unlikely to be affected by the addition of any possible variant of the acoustic reflectors 1111 and 1112, and will likely continue to radiate in an omnidirectional pattern of acoustic radiation. However, sounds having wavelengths that are within the order of magnitude of the size of the diaphragms of respective ones of the acoustic drivers 191 and 192*a-c* and shorter wavelength sounds are more amenable to being "steered" through the addition of various variants of the acoustic reflectors 1111 and/or 1112. For sounds of these wavelengths, it may be deemed desirable to employ such acoustic reflectors to perhaps create effective directions of maximum acoustic radiation that are bent away from a wall (such as the wall 912) or a table surface (such as a table that might support the audio device 100 in the physical orientation depicted in FIG. 1*a*) so as to reduce acoustic effects of sounds reflecting off of such surfaces, and thereby, perhaps enable the left audio, center audio and/or right audio acoustic interference arrays to be configured more easily.

It should be noted that although FIGS. 4*a* and 4*b* depict somewhat simple forms of acoustic reflectors, other variants of the audio device 100 are possible in which more complex acoustic reflectors are employed, including and not limited to horn structures or various possible forms of an acoustic lens or prism (not shown) in which at least reflection (perhaps along with other techniques) are employed to "steer" sounds of at least one predetermined range of frequencies.

Figure 5:
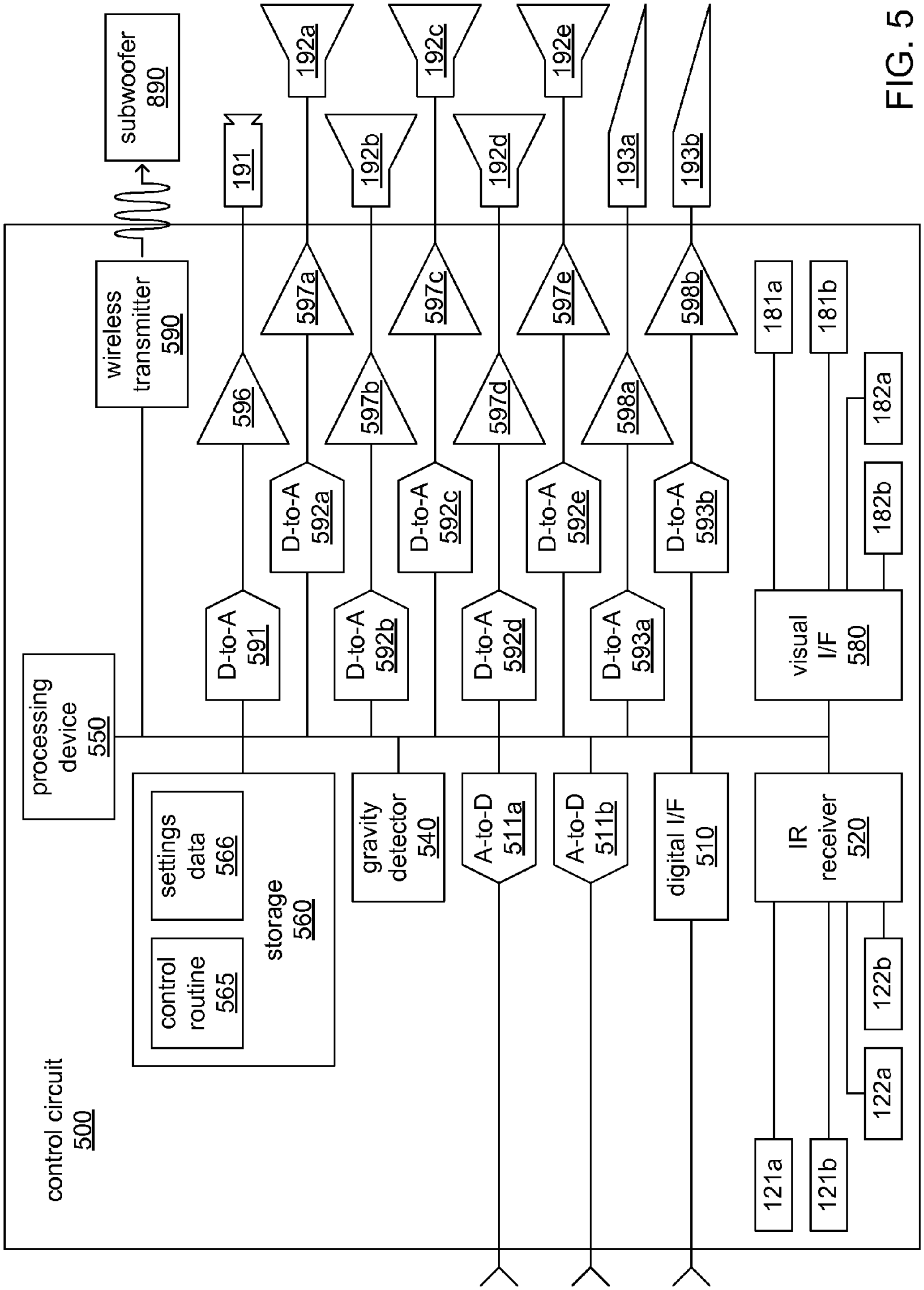
FIG. 5 is a block diagram of a possible architecture of the audio device of FIGS. 1*a-b*.

FIG. 5 is a block diagram of a possible electrical architecture of the audio device 100. Where the audio device 100 employs the depicted architecture, the audio device 100 further incorporates a digital interface (I/F) 510 and/or at least a pair of analog-to-digital (A-to-D) converters 511*a* and 511*b*; an IR receiver 520; at least one gravity detector 540; a storage 560; perhaps a visual interface (I/F) 580; perhaps a wireless transmitter 590; digital-to-analog converters 591, 592*a-e* and 593*a-b*; and audio amplifiers 596, 597*a-e* and 598*a-b*. One or more of these may be coupled to a processing device 550 that is also incorporated into the audio device 100.

The processing device 550 may be any of a variety of types of processing device based on any of a variety of technologies, including and not limited to, a general purpose central processing unit (CPU), a digital signal processor (DSP) or other similarly specialized processor having a limited instruction set optimized for a given range of functions, a reduced instruction set computer (RISC) processor, a microcontroller, a sequencer or combinational logic. The storage 560 may be based on any of a wide variety of information storage technologies, including and not limited to, static RAM (random access memory), dynamic RAM, ROM (read-only memory) of either erasable or non-erasable form, FLASH, magnetic memory, ferromagnetic media storage, phase-change media storage, magneto-optical media storage or optical media storage. It should be noted that the storage 560 may incorporate both volatile and nonvolatile portions, and although it is depicted in a manner that is suggestive of each being a single storage device, the storage 160 may be made up of multiple storage devices, each of which may be based on different technologies. It is preferred that each of the storage 560 is at least partially based on some form of solid-state storage technology, and that at least a portion of that solid-state technology be of a non-volatile nature to prevent loss of data and/or routines stored within.

The digital I/F 510 and the A-to-D converters 511*a* and 511*b* (whichever one(s) are present) are coupled to various connectors (not shown) that are carried by the casing 110 to enable coupling of the audio device 100 to another device (not shown) to enable receipt of digital and/or analog signals (conveyed either electrically or optically) representing audio to be played through one or more of the acoustic drivers 191, 192*a-e* and 193*a-b* from that other device. With just the two A-to-D converters 511*a* and 511*b* depicted, a pair of analog electrical signals representing two audio channels (e.g., left and right audio channels making up stereo sound) may be received. With additional A-to-D converters (not shown) a multitude of analog electrical signals representing three, four, five, six, seven or more audio channels (e.g., various possible implementations of "quadraphonic" or surround sound) may be received. The digital I/F 510 may be made capable of accommodating electrical, timing, protocol and/or other characteristics of any of a variety of possible widely known and used digital interface specifications in order to receive at least audio represented with digital signals, including and not limited to, Ethernet (IEEE-802.3) or FireWire (IEEE-1394) promulgated by the Institute of Electrical and Electronics Engineers (IEEE) of Washington, D.C.; Universal Serial Bus (USB) promulgated by the USB Implementers Forum, Inc. of Portland, Oreg.; High-Definition Multimedia Interface (HDMI) promulgated by HDMI Licensing, LLC of Sunnyvale, Calif.; DisplayPort promulgated by the Video Electronics Standards Association (VESA) of Milpitas, Calif.; and Toslink (RC-5720C) maintained by the Japan Electronics and Information Technology Industries Association (JEITA) of Tokyo (or the electrical equivalent employing coaxial cabling and so-called "RCA connectors") by which audio is conveyed as digital data complying with the Sony/Philips Digital Interconnect Format (S/PDIF) maintained by the International Electrotechnical Commission (IEC) of Geneva, Switzerland, as IEC 60958. Where the digital I/F 510 receives signals representing video in addition to audio (as in the case of receiving an audio/visual program that incorporates both audio and video), the digital I/F may be coupled to the multitude of connectors necessary to enable the audio device 100 to "pass through" at least the signals representing video to yet another device (e.g., the visual device 880) to enable the display of that video.

The IR receiver 520 is coupled to the IR sensors 121*a-b* and 122*a-b* to enable receipt of IR signals through one or more of the IR sensors 121*a-b* and 122*a-b* representing commands for controlling the operation of at least the audio device 100. Such signals may indicate one or more commands to power the audio device 100 on or off, to mute all acoustic output of the audio device 100, to select a source of audio to be acoustically output, set one or more parameters for acoustic output (including volume), etc.

The gravity detector 540 is made up of one or more components able to sense the direction of the force of gravity relative to the casing 110, perhaps relative to at least one of the axes 116, 117 or 118. The gravity detector 540 may be implemented using any of a variety of technologies. For example, the gravity detector 540 may be implemented using microelectro-mechanical systems (MEMS) technology physically implemented as one or more integrated circuits incorporating one or more accelerometers. Also for example, the gravity detector 540 may be implemented far more simply as a steel ball (e.g., a steel ball bearing) within a container having multiple electrical contacts disposed within the container, with the steel ball rolling into various positions depending on the physical orientation of the casing 110 where the steel ball may couple various combinations of the electrical contacts depending on how the steel ball is caused to be positioned within that container under the influence of the force of gravity. In essence, an indication of the orientation of the casing 110 relative to the direction of the force of gravity is employed as a proxy for indicating the direction of a listening position (such as the listening position 905) relative to the casing based on the assumptions that whatever listening position will be positioned at least generally at the same elevation as the casing 110, and that whatever listener at that listening position will be facing the casing 110 such that the ends 113*a* and 113*b* extend laterally across the space that is "in front of" that listener. Thus, the assumptions are made that the listener will not be positioned more above or below the casing 110 than horizontally away from it, and that the listener will at least not be facing one of the ends 113*a* or 113*b* of the casing.

It should be noted that although use of the gravity detector 540 to detect the orientation of the casing 110 relative to the direction of the force of gravity is preferred (largely due to it automating the detection of the orientation of the casing such that manual input provided by a person is not required), other forms of orientation input device may be employed, either as an alternative to the gravity detector 540, or to provide a way to override the gravity detector 540. By way of example, a manually-operable control (not shown) may be disposed on the casing 110 in a manner that is accessible to a person installing the audio device 100 and/or listening to it, thereby allowing that person to operate that control to manually indicate the orientation of the casing 110 to the audio device 100 (or more precisely, perhaps, to the processing device 550). Use of such manual input may invite the possibility of erroneous input from a person who forgets to operate that manually-operable control to provide a correct indication of orientation, however, use of such manual input may be deemed desirable in some situations in which circumstances exist that may confuse the gravity detector 540 (e.g., where the audio device 100 is installed in a vehicle where changes in direction may subject the gravity detector 540 to various non-gravitational accelerations that may confuse it, or where the audio device 100 is installed on a fold-down door of a piece of furniture used enclose a form of the audio system 1000 when not in use such that the orientation of the casing 110 relative to the force of gravity could actually change). By way of another example, one or more contact switches or other proximity-detecting sensors (not shown) may be incorporated into the casing 110 to detect the pressure exerted on a portion of the casing 110 from being set upon or mounted against a supporting surface (or a proximity of a portion of the casing 110 to a supporting surface) such as a wall or table to determine the orientation of the casing 110.

Where the audio device 100 is to provide a viewable indication of its status, the audio device 100 may incorporate the visual I/F 580 coupled to the visual indicators 181*a-b* and

182*a-b* to enable the display of such an indication. Such status information displayed for viewing may be whether the audio device 100 is powered on or off, whether all acoustic output is currently muted, whether a selected source of audio is providing stereo audio or surround sound audio, whether the audio device 100 is receiving IR signals representing commands, etc.

Where the audio device 100 is to acoustically output audio in conjunction with another audio device also having acoustic output capability (e.g., the subwoofer 890), the audio device 100 may incorporate the wireless transmitter 590 to transmit a wireless signal representing a portion of received audio to be acoustically output to that other audio device. The wireless transmitter 590 may be made capable of accommodating the frequency, timing, protocol and/or other characteristics of any of a variety of possible widely known and used specifications for IR, radio frequency (RF) or other form of wireless communications, including and not limited to, IEEE 802.11a, 802.11b or 802.11g promulgated by the Institute of Electrical and Electronics Engineers (IEEE) of Washington, D.C.; Bluetooth promulgated by the Bluetooth Special Interest Group of Bellevue, WA; or ZigBee promulgated by the ZigBee Alliance of San Ramon, Calif. Alternatively, some other form of low-latency RF link conveying either an analog signal or digital data representing audio at an available frequency (e.g., 2.4 GHz) may be formed between the wireless transmitter 950 of the audio device 100 and that other audio device (e.g., the subwoofer 890). It should be noted that despite this depiction and description of the use of wireless signaling to convey a portion of received audio to another audio device (e.g., the subwoofer 890), the audio device 100 may be coupled to such another audio device via electrically and/or optically conductive cabling as an alternative to wireless signaling for conveying that portion of received audio.

The D-to-A converters 591, 592*a-e* and 593*a-b* are coupled to the acoustic drivers 191, 192*a-e* and 193*a-b* through corresponding ones of audio amplifiers 596, 597*a-e* and 598*a-b*, respectively, that are also incorporated into the audio device 100 to enable the acoustic drivers 191, 192*a-e* and 193*a-b* to each be driven with amplified analog signals to acoustically output audio. One or both of these D-to-A converters and these audio amplifiers may be accessible to the processing device 550 to adjust various parameters of the conversion of digital data representing audio into analog signals and of the amplification of those analog signals to create the amplified analog signals.

Stored within the storage 560 is a control routine 565 and a settings data 566. The processing device 550 accesses the storage 560 to retrieve a sequence of instructions of the control routine 565 for execution by the processing device 550. During normal operation of the audio device 100, execution of the control routine 565 causes the processing device to monitor the digital I/F 510 and/or the A-to-D converters 511*a-b* for indications of receiving audio from another device to be acoustically output (presuming that the audio device 100 does not, itself, incorporate a source of audio to be acoustically output, which may be the case in other possible embodiments of the audio device 100). Upon receipt of such audio, the processing device 550 is caused to employ a multitude of digital filters (as will be explained in greater detail) to derive portions of the received audio to be acoustically output by one or more of the acoustic drivers 191, 192*a-e* and 193*a-b*, and possibly also by another audio device such as the subwoofer 890. The processing device 550 causes such acoustic output to occur by operating one or more of the D-to-A converters 591, 592*a-e* and 593*a-b*, as well as one or more of the audio amplifiers 596, 597*a-e* and 598*a-b*, and perhaps also the wireless transmitter 590, to drive one or more of these acoustic drivers, and perhaps also an acoustic driver of whatever other audio device receives the wireless signals of the wireless transmitter 590.

As part of such normal operation, the processing device 550 is caused by its execution of the control routine 565 to derive the portions of the received audio to be acoustically output by more than one of the acoustic drivers 192*a-e* and to operate more than one of the D-to-A converters 592*a-e* in a manner that results in the creation of one or more acoustic interference arrays using the acoustic drivers 192*a-e* in the manner previously described.

Also as part of such normal operation, the processing device 550 is caused by its execution of the control routine 565 to access and monitor the IR receiver 520 for indications of receiving commands affecting the manner in which the processing device 550 responds to receiving a piece of audio via the digital I/F 510 and/or the A-to-D converters 511*a* and 511*b* (and perhaps still more A-to-D converters for more than two audio channels received via analog signals); affecting the manner in which the processing device 550 derives portions of audio from the received audio for being acoustically output by one or more of the acoustic drivers 191, 192*a-e* and 193*a-b*, and/or an acoustic driver of another audio device such as the subwoofer 890; and/or affecting the manner in which the processing device operates at least the D-to-A converters 591, 592*a-e* and 593*a-b*, and/or the wireless transmitter 590 to cause the acoustic outputting of the derived portions of audio. The processing device 550 is caused by its execution of the control routine 565 to determine what commands have been received and what actions to take in response to those commands.

Further as part of such normal operation, the processing device 550 is caused by its execution of the control routine 565 to access and operate the visual I/F 580 to cause one or more of the visual indicators 181*a-b* and 182*a-b* to display human viewable indications of the status of the audio device 100, at least in performing the task of acoustically outputting audio.

Still further as part of such normal operation, the processing device 550 is caused by its execution of the control routine 565 to access the gravity detector 540 (or whatever other form of orientation input device may be employed in place of or in addition to the gravity detector 540) to determine the physical orientation of the casing 110 relative to the direction of the force of gravity. The processing device 550 is caused to determine which ones of the IR sensors 121*a-b* and 122*a-b*, and which ones of the visual indicators 181*a-b* and 182*a-b* to employ in receiving IR signals conveying commands and in providing visual indications of status, and which ones of these to disable. Such selective disabling may be deemed desirable to reduce consumption of power, to avoid receiving stray signals that are not truly conveying commands via IR signals, and/or to simply avoid providing a visual indication in a manner that looks visually disagreeable to a user of the audio device 100. For example, where the audio device 100 has been positioned in one of the ways depicted in FIG. 1*b* with the face 111 facing the floor 911, there may be little chance of receiving IR signals via the IR sensors 121*a* and 121*b* as a result of their facing the floor 911 (such that allowing them to consume power may be deemed wasteful), and the provision of visual indications of status using the visual indicators 181*a* and 181*b* may look silly to a user. Also for example, where the audio device 100 has been positioned as depicted in FIG. 1*a* with the face 112 facing upwards towards a ceiling of the room 900, there may be the possibility of overhead fluorescent lighting mounted on that ceiling emitting light at IR frequencies that may provide repeated false indications of commands being conveyed via IR such that the receipt of actual IR signals conveying commands may be interfered with, and the provision of visual indications of status using the visual indicators 182*a* and 182*b* in an upward direction may be deemed distracting and/or may be deemed to look silly by a user of the audio device 100.

Yet further, and as will shortly be explained, the processing device 550 also employs the determination it was caused to make of the physical orientation of the casing 110 relative to the direction of the force of gravity in altering the manner in which the processing device 550 derives the portions of audio to be acoustically output, and perhaps also in selecting which ones of the acoustic drivers 191, 192*a-e* and 193*a-b* are used in acoustically outputting portions of audio. More precisely, the determination of the orientation of the casing 110 relative to the direction of the force of gravity is employed in selecting one or more of the acoustic drivers 191, 192*a-b* and 193*a-b* to be disabled or enabled for acoustic output; and/or in selecting filter coefficients to be used in configuring filters to derive the portions of received audio that are acoustically output by each of the acoustic drivers 191, 192*a-e* and 193*a-b*.

It should be noted that although the components of the electrical architecture depicted in FIG. 5 is described as being incorporated into the audio device 100 such that they are disposed within the casing 110, other embodiments of the audio device 100 are possible having more than one casing such that at least some of the depicted components of the electrical architecture of FIG. 5 are disposed within another casing separate from the casing 110 in which the acoustic drivers 191, 192*a-e* and 193*a-b* are disposed, and that the casing 110 and the other casing may be linked wirelessly or via cabling to enable the portions of audio derived by the processing device 550 for output by the different ones of the acoustic drivers 191, 192*a-e* and 193*a-b* to be conveyed to the casing 110 from the other casing for being acoustically output. Indeed, in some embodiments, the other casing may be the casing of the subwoofer 890 such that the components of the depicted electrical architecture are distributed among the casing of the subwoofer 890 and the casing 110, and such that perhaps the wireless transmitter 590 actually transmits portions of audio from the casing of the subwoofer 890 to the casing 110, instead of vice versa as discussed, earlier.

Figure 6A:
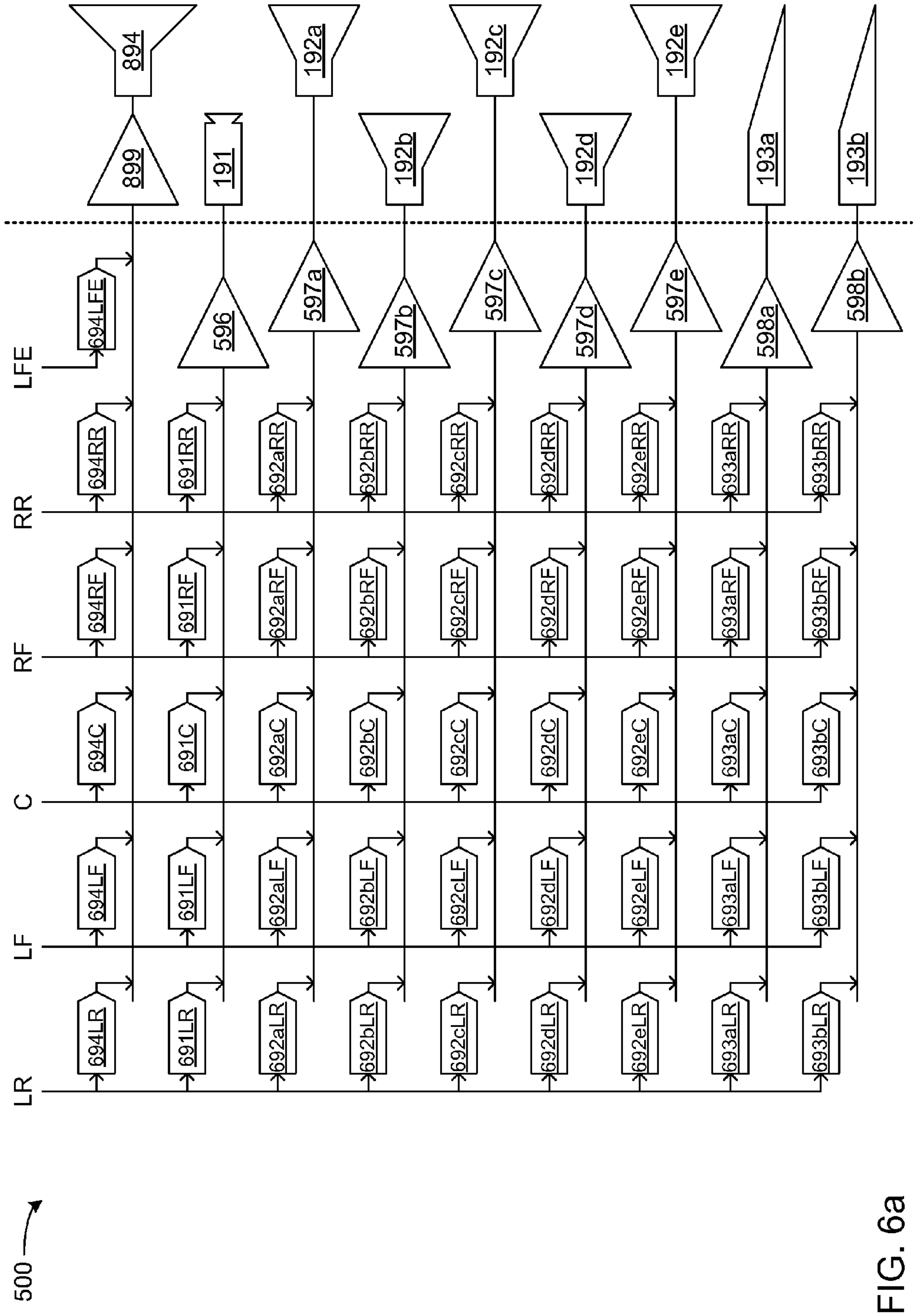
FIGS. 6*a* and 6*b* are block diagrams of possible filter architectures that may be implemented by a processing device of the audio device of FIGS. 1*a-b*.

FIG. 6*a* is a block diagram of an example of a possible filter architecture that the processing device 550 may be caused to implement by its execution of a sequence of instructions of the control routine 565 in circumstances where audio received from another device (not shown) is made up of six audio channels (i.e., five-channel surround sound audio, and a low frequency effects channel), and the processing device 550 is to derive portions of the received audio for all of the acoustic drivers 191, 192*a-e* and 193*a-b*, as well as an acoustic driver 894 of the subwoofer 890. More precisely, in an electrical architecture such as what is depicted in FIG. 5, where there are no filters implemented in physically tangible form from electronic components, a processing device (e.g., the processing device 550) must implement the needed filters by creating virtual instances of digital filters (i.e., by "instantiating" digital filters) within a memory storage (e.g., the storage 560). Thus, the processing device 550 will employ any of a variety of known techniques to divide its available processing resources to perform the calculations of each instantiated filter at recurring intervals to thereby create the equivalent of the functionality that would be provided if each of the instantiated filters were a filter that physically existed as actual electronic components.

As a result of the received audio being made up of five audio channels and a low frequency effects (LFE) channel, and as a result of the need to derive portions of the received audio for each of nine different acoustic drivers, a 5×9 array of digital filters is instantiated, as depicted in FIG. 6*a*. Thus, as should be noted, the dimensions of this array of digital filters is at least partially determined by such factors, and can change as circumstances change. For example, if different audio with a different quantity of audio channels were received, or if a user of the audio device 100 were to choose to cease to use the audio device 100 in conjunction with the subwoofer 890, then the dimensions would change to reflect the change in the quantity of audio channels to whatever new quantity, or the reduction in the quantity of acoustic drivers for which audio portions must be derived from nine to eight. As depicted, the audio channels are the left-rear audio channel (LR), the left-front audio channel (LF), the center audio channel (C), the right-front audio channel (RF) and the right rear audio channel (RR), as well as the LFE channel (LFE). Also, as depicted, each filter in this array of instantiated digital filters is given a reference number reflective of the audio channel and the acoustic driver to which it is coupled. Thus, for instance, all five of the digital filters associated with the acoustic driver 191 are given reference numbers starting with the digits 691, and for instance, all nine of the digital filters associated with audio channel C are given reference numbers ending with the letter C. It should also be noted that for the sake of avoiding visual clutter, summing nodes to sum the outputs of all digital filters for each one of these acoustic drivers are shown only with horizontal lines, rather than with a distinct summing node symbol. It should also be noted that for the sake of avoiding visual clutter, the D-to-A converters depicted in FIG. 5 have been omitted such that corresponding ones of the horizontal lines representative of summing nodes are routed directly to the inputs of the corresponding ones of the audio amplifiers of corresponding ones of the acoustic drivers.

It is preferred during normal operation of the audio device 100 in conjunction with the subwoofer 890 that the lower frequency sounds (e.g., sounds of a frequency of 250 Hz or lower) of the received audio in each of the five audio channels (LR, LF, C, RF and RR) be separated from mid-range and higher frequency sounds, be combined with some predetermined relative weighting with the LFE channel, and be directed towards the subwoofer 890. Thus, the processing device 550 is caused to provide coefficients to each of the filters 694LR, 694LF, 694C, 694RF and 694RR that cause these five filters to function as low pass filters, and to provide a coefficient to the filter 694LFE to implement desired weighting. The outputs of all six of these filters are summed and the results are transmitted via the wireless transmitter 590 (also omitted in FIG. 6*a* for the sake of avoiding visual clutter) to the subwoofer 890 to be amplified by an audio amplifier 899 of the subwoofer 890 for driving an acoustic driver 894 of the subwoofer 890. As will be familiar to those skilled in the art of the design of subwoofers, subwoofers are typically designed to be optimal for acoustically outputting lower frequency sounds (i.e., sounds towards the lower limit of the range of frequencies within human hearing), and given the very long wavelengths of those sounds provided to typical subwoofers, the acoustic output of subwoofers tends to be very omnidirectional in its pattern of radiation. Thus, the acoustic output of the subwoofer 890 does not have a very discernable direction of maximum acoustic radiation. It is envisioned that this routing of all lower frequency sounds to the acoustic driver 894 of the subwoofer 890 be carried out regardless of the physical orientation of the casing 110, and that the same cutoff frequency be employed in defining the upper limit of the range of the lower frequencies of sounds that are so routed across all five of the filters 694LR, 694LF, 694C, 694RF and 694RR.

It is correspondingly preferred during normal operation of the audio device 100 in conjunction with the subwoofer 890 that mid-range frequency sounds (e.g., sounds in a range of frequencies between 250 Hz and 3 KHz) in each of the five audio channels be separated from lower and higher frequency sounds, and be directed towards appropriate ones of the acoustic drivers 192*a-e* in a manner that implements separate acoustic interference arrays for a left acoustic output, a center acoustic output and a right acoustic output. It is envisioned that the mid-range frequency sounds of the LF and LR audio channels be combined with equal weighting to form a single mid-range left audio channel that is then provided to two or more of the acoustic drivers 192*a-e* in a manner that their combined acoustic output defines the previously mentioned left audio acoustic interference array operating in a manner that causes a listener at the listening position 905 to perceive the mid-range left audio channel as emanating in their direction from a location laterally to the left of the audio device 100 (referring to FIGS. 1*a*and 1*b*, this would be from a location along the wall 912 and further away from the wall 913 than the location of the audio device 100). It is also envisioned that the mid-range frequency sounds of the RF and RR audio channels be similarly combined to form a single mid-range right audio channel that is then provided to two or more of the acoustic drivers 192*a-e* in a manner that their combined acoustic output defines the previously mentioned right audio acoustic interference array operating in a manner that causes a listener at the listening position 905 to perceive the mid-range right audio channel as emanating in their direction from a location laterally to the right of the audio device 100 (referring to FIGS. 1*a* and 1*b*, this would be from a location along the wall 912 and in the vicinity of the wall 913). It is further envisioned that the mid-range frequency sounds of the C audio channel be provided to two or more of the acoustic drivers 192*a-e* in a manner that their combined acoustic output defines the previously mentioned center audio acoustic interference array operating in a manner that causes a listener at the listening position 905 to perceive the result mid-range center audio channel as emanating in their direction directly from the center of the casing 110 of the audio device 100.

It should be noted that each of the left audio, center audio and right audio acoustic interference arrays may be created using any combination of different ones of the acoustic drivers 192*a-e*. Thus, although it may be counterintuitive, the right audio acoustic interference array may be formed using ones of the acoustic drivers 192*a-e* that are actually positioned laterally to the left of a listener at the listening position 905. In other words, referring to FIG. 1*a*, the acoustic drivers 192*a* and 192*b* (which are towards the end 113*a* of the casing 110) could be employed to form a acoustic interference array operating in a manner that causes a listener at the listening position 905 to perceive the audio of that acoustic interference array as emanating from a location in the vicinity of the wall 913 (i.e., from a location beyond the other end 113*b* of the casing 110), even though using the acoustic drivers 192*d* and 192*e* to form that acoustic interference array may be easier and/or more effectively bring about the desired perception of direction from which those sounds emanate. However, it is preferable to employ at least ones of the acoustic drivers 192*a-e* that are closest to the direction in which it is intended that audio of an acoustic array be directed. Further, it may be that all five of the acoustic drivers 192*a-e* are employed in forming all three of the left audio, center audio and right audio acoustic interference arrays, and as those skilled in the art of acoustic interference arrays will recognize, doing so may be advantageous, depending at least partly on what frequencies of sound are acoustically output by these acoustic interference arrays.

Given this flexibility in selecting ones of the acoustic drivers 192*a-e* to form the left audio, center audio and right audio acoustic interference arrays, the coefficients provided to the filters corresponding to each of the acoustic drivers 192*a-e* necessarily depend upon which ones of the acoustic drivers 192*a-e* are selected to form each of these three acoustic interference arrays. If, for example, the acoustic drivers 192*a-c* were selected to form the left audio acoustic interference array, the acoustic drivers 192*b-d* were selected to form the center audio acoustic interference array, and the acoustic drivers 192*c-e* were selected to form the center audio acoustic interference array (as might be deemed desirable where the casing 110 is oriented as shown in FIG. 1*a*, or as shown in the position closer to the floor 911 in FIG. 1*b*), then some of the filters associated with each of the acoustic drivers 192*a-e* would be provided by the processing device 550 with coefficients that would effectively disable them while others would be provided by the processing device 550 with coefficients that would both combine mid-range frequencies of appropriate ones of the five audio channels and form each of these acoustic interference arrays.

More specifically in this example, in the case of the acoustic driver 192*a*, the filters 692*a*C, 692*a*RF and 692*a*RR would be provided with coefficients that disable them (such that none of the C, RF or RR audio channels in any way contribute to the portion of the received audio that is acoustically output by the acoustic driver 192*a*), while the filters 692*a*LR and 692*a*LF would be provided with coefficients to provide derived variants of the mid-range frequencies of the LF and LR audio channels to the acoustic driver 192*a* to enable the acoustic driver 192*a* to become part of the left audio acoustic interference array along with the acoustic drivers 192*b* and 192*c*. In the case of the acoustic driver 192*b*, the filters 692*b*RF and 692*b*RR would be provided with coefficients that disable them, while the filters 692*b*LR and 692*b*LF would be provided with coefficients to provide derived variants of the mid-range frequencies of the LF and LR audio channels to the acoustic driver 192*b* to enable the acoustic driver 192*b* to become part of the left audio acoustic interference array along with the acoustic drivers 192*a* and 192*c*, and the filter 692*b*C would be provided with a coefficient to provide a derived variant of the mid-range frequencies of the C audio channel to the acoustic driver 192*b* to enable the acoustic driver 192*b* to become part of the center audio acoustic interference array along with the acoustic drivers 192*c* and 192*d*. In the case of the acoustic driver 192*c*, the filters 692*c*LR and 692*c*LF would be provided with coefficients to provide derived variants of the mid-range frequencies of the LF and LR audio channels to the acoustic driver 192*c* to enable the acoustic driver 192*c* to become part of the left audio acoustic interference array along with the acoustic drivers 192*a* and 192*b*, the filter 692*b*C would be provided with a coefficient to provide a derived variant of the mid-range frequencies of the C audio channel to the acoustic driver 192*c* to enable the acoustic driver 192*c* to become part of the center audio acoustic interference array along with the acoustic drivers 192*b* and 192*d*, and the filters 692*c*RF and 692*c*RR would be provided with coefficients to provide derived variants of the mid-range frequencies of the RF and RR audio channels to the acoustic driver 192*c* to enable the acoustic driver 192*c* to become part of the right audio acoustic interference array along with the acoustic drivers 192*d* and 192*e*. In the case of the acoustic driver 192*d*, the filters 692*d*LF and 692*d*LR would be provided with coefficients that disable them, while the filters 692*d*RR and 692*d*RF would be provided with coefficients to provide derived variants of the mid-range frequencies of the RF and RR audio channels to the acoustic driver 192*d* to enable the acoustic driver 192*d* to become part of the right audio acoustic interference array along with the acoustic drivers 192*c* and 192*e*, and the filter 692*d*C would be provided with a coefficient to provide a derived variant of the mid-range frequencies of the C audio channel to the acoustic driver 192*d* to enable the acoustic driver 192*d* to become part of the center audio acoustic interference array along with the acoustic drivers 192*b* and 192*c*. In the case of the acoustic driver 192*e*, the filters 692*e*C, 692*e*LF and 692*e*LR would be provided with coefficients that disable them, while the filters 692*e*RR and 692*e*RF would be provided with coefficients to provide derived variants of the mid-range frequencies of the RF and RR audio channels to the acoustic driver 192*e* to enable the acoustic driver 192*e* to become part of the right audio acoustic interference array along with the acoustic drivers 192*c* and 192*d*.

It is correspondingly preferred during normal operation of the audio device 100, whether in conjunction with the subwoofer 890 or not, that higher frequency sounds (e.g., sounds of a frequency of 3 KHz or higher) of the received audio in each of the five audio channels be separated from mid-range and lower frequency sounds, and be directed towards appropriate ones of the acoustic drivers 191, 192*c* and/or 193*a-b*. It is envisioned that the higher frequency sounds of the LF and LR audio channels be combined with equal weighting to form a single higher frequency left audio channel that is then provided to one of the acoustic drivers 193*a* or 193*b* to employ its very narrow pattern of acoustic radiation in a manner that causes a listener at the listening position 905 to perceive the higher frequency left audio channel as emanating in their direction from a location laterally to the left of the audio device 100 (from the perspective of a person facing the audio device 100—again, this would be from a location along the wall 912 and further away from the wall 913 than the location of the audio device 100). It is also envisioned that the higher frequency sounds of the RF and RR audio channels be similarly combined to form a single higher frequency right audio channel that is then provided to the other one of the acoustic drivers 193*a* or 193*b* to employ its very narrow pattern of acoustic radiation in a manner that causes a listener at the listening position 905 to perceive the higher frequency right audio channel as emanating in their direction from a location laterally to the right of the audio device 100 (from the perspective of a person facing the audio device 100—again, this would be from a location along the wall 912 and in the vicinity of the wall 913). It is further envisioned that the higher frequency sounds of the C audio channel be provided to one or the other of the acoustic drivers 191 or 192*c*, depending on the physical orientation of the casing 110 relative to the direction of the force of gravity, such that whichever one of the acoustic drivers 191 or 192*c* is positioned such that the direction of its maximum acoustic radiation is directed more closely towards at least the vicinity of the listening position 905 becomes the acoustic driver employed to acoustically output the higher frequency sounds of the C audio channel, thus causing a listener at the listening position 905 to perceive the higher frequency sounds of the C audio channel as emanating in their direction directly from the center of the casing 110 of the audio device 100. The processing device 550 is caused by its execution of the control routine 565 to employ the gravity detector 540 (or whatever other form of orientation input device in addition to or in place of the gravity detector 540) in determining the direction of the force of gravity for the purpose of determining which of the acoustic drivers 191 or 192*c* is to be employed to acoustically output the higher frequency sounds of the C audio channel. Where the casing 110 is physically oriented as depicted in FIG. 1*a*, such that axis 117 is parallel with the direction of the force of gravity, and therefore the direction of maximum acoustic radiation of the acoustic driver 191 (indicated by the arrow 196) is thus likely directed towards at least the vicinity of the listening position 905, the processing device 550 is caused to provide the filter 691C with a coefficient that would pass high-frequency C audio channel sounds to the acoustic driver 191, while providing the filters 691LR, 691LF, 691RF and 691RR with coefficients that disable them; and further not providing the filter 692*c*C with a coefficient that passes through those higher frequency C audio channel sounds through to the acoustic driver 192*c*. Alternatively, where the casing 110 is physically oriented in either of the two orientations depicted in FIG. 1*b*, such that axis 116 is parallel with the direction of the force of gravity, and therefore the direction of maximum acoustic radiation of the acoustic driver 192*c* is likely directed towards at least the vicinity of the listening position 905, the processing device 550 is caused to provide the filter 692*c*C with a coefficient that would pass high-frequency C audio channel sounds to the acoustic driver 192*c* (in addition to whatever mid-range frequency sounds of the C audio channel may also be passed through that same filter), while providing the filters 691LR, 691LF, 691C, 691RF and 691RR with coefficients that disable all of them such that the acoustic driver 191 is disabled, and thus, not employed to acoustically output any sound, at all.

The intention behind acoustically outputting higher frequency left and right audio sounds via the highly directional acoustic drivers 193*a* and 193*b*, and the intention behind acoustically outputting mid-range left, center and right audio sounds via acoustic interference arrays formed among the acoustic drivers 192*a-e* is to recreate the greater lateral spatial effect that a listener at the listening position 905 would normally experience if there were separate front left, center and front right acoustic drivers positioned far more widely apart as would be the case in a more traditional layout of acoustic drivers in separate casings positioned widely apart along the wall 912. The use of the highly directional acoustic drivers 193*a* and 193*b* to direct higher frequency sounds laterally to the left and right of the listening position 905, as well as the use of acoustic interference arrays formed by the acoustic driver 192*a-e* to also direct mid-range frequency sounds laterally to the left and right of the listening position 905 creates the perception on the part of a listener at the listening position 905 that left front and right front sounds are coming at him or her from the locations where they would normally expect to see distinct left front and right front acoustic drivers within separate casings. In this way, the audio device 100 is able to effectively do the work traditionally done by multiple audio devices having acoustic drivers to acoustically output audio.

As previously discussed above, at length, the delays and filtering employed in configuring filters to form each of these acoustic interference arrays must change in response to changes in the physical orientation of the audio device 100 to take into account at least which of the axes 116 or 117 is directed towards the listening area 905, and which isn't. Again, this is necessary in controlling the manner in which the acoustic outputs of each of the acoustic drivers 192*a-e* interfere with each other in either constructive or destructive ways to direct the sounds of each of these acoustic interference arrays in their respective directions. The coefficients provided to the filters making up the array of filters depicted in FIG. 6*a* cause the filters to implement these delays and filtering, and these coefficients differ among the different possible physical orientations in which the audio device 100 may be placed.

It is envisioned that one embodiment of the audio device 100 will detect at least the difference in physical orientation between the manner in which the casing 110 is oriented in FIG. 1*a* and the manner in which the casing 110 is depicted as oriented in the position under the visual device in FIG. 1*b* (i.e., detect a rotation of the casing 110 about the axis 118). Thus, it is envisioned that the settings data 566 will incorporate a first set of filter coefficients for the array of filters depicted in FIG. 6*a* for when the casing 110 is oriented as depicted in FIG. 1*a* and a second set of filter coefficients for that same array of filters for when the casing 110 is oriented as depicted in the position under the visual device 880 in FIG. 1*b*. Thus, in this one embodiment, an assumption is made that the casing 110 is always positioned relative to the listening position 905 such that the end 113*a* is always positioned laterally to the left of a listener at the listening position 905 and such that the end 113*b* is always positioned laterally to their right.

However, it is also envisioned that another embodiment of the audio device 100 will additionally detect the difference in physical orientation between the two different manners in which the casing 110 is oriented in FIG. 1*b* (i.e., detect a rotation of the casing 110 about the axis 117). Thus it is envisioned that the settings data 566 will incorporate a third set of filter coefficients for when the casing 110 is oriented as depicted in the position above the visual device 880 in FIG. 1*b*. Alternatively, it is envisioned that the processing device 550 may respond to detecting the casing 110 being in such an orientation by simply transposing the filter coefficients between filters associated with the LR and RR audio channels, and between filters associated with the LF and RF audio channels to essentially "swap" left and right filter coefficients among the filters in the array of filters depicted in FIG. 6*a*. More precisely as an example, the filter coefficients of the filters 694LR, 691LR, 692*a*LR, 692*b*LR, 692*c*LR, 692*d*LR, 692*e*LR, 693*a*LR and 693*b*LR would be swapped with the filter coefficients of the filters 694RR, 691RR, 692*a*RR, 692*b*RR, 692*c*RR, 692*d*RR, 692*e*RR, 693*a*RR and 693*b*RR, respectively.

Figure 6B:
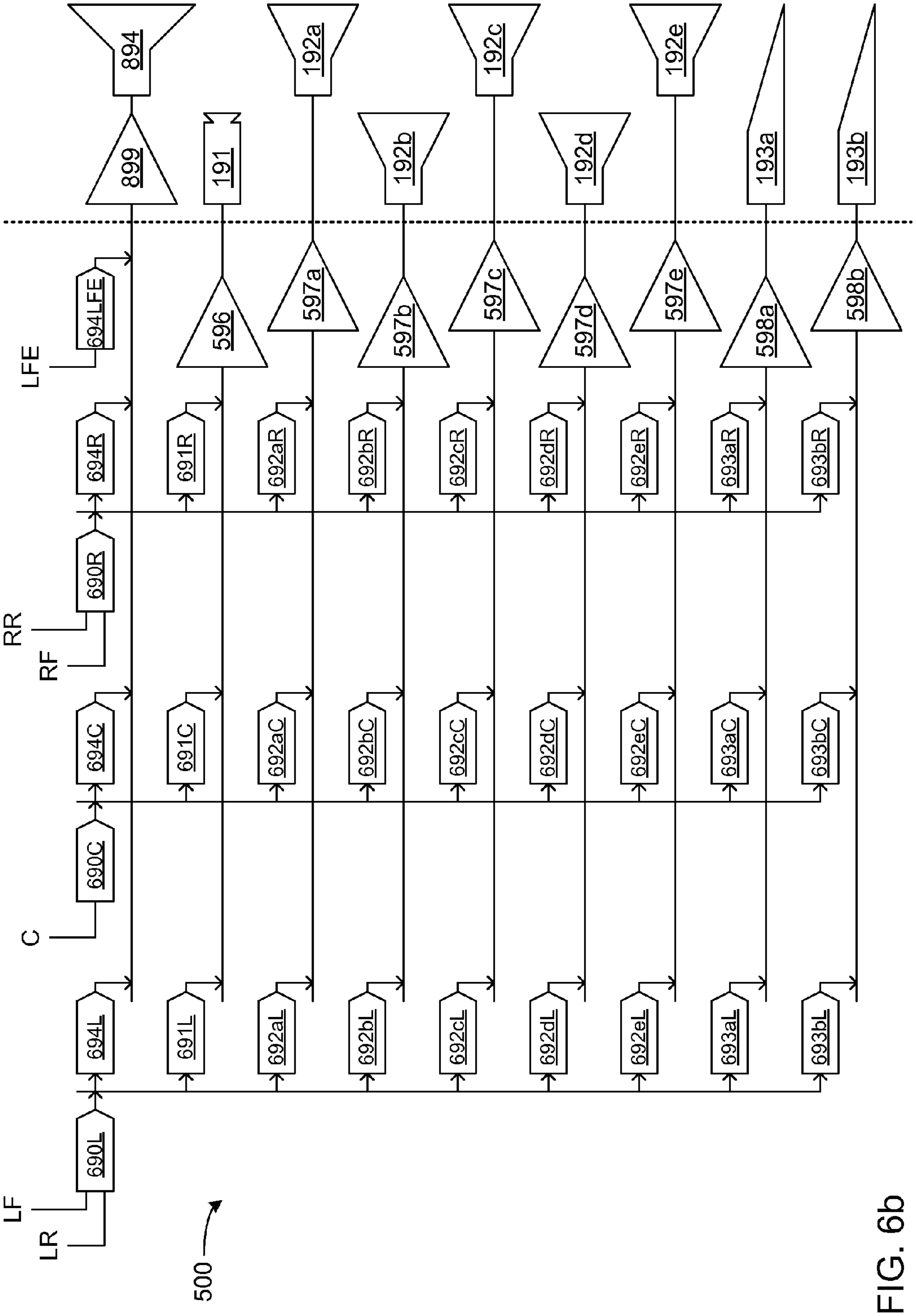

FIG. 6*b* is a block diagram of an alternate example of a possible filter architecture that the processing device 550 may be caused to implement by its execution of a sequence of instructions of the control routine 565 in circumstances where audio received from another device (not shown) is made up of five audio channels (i.e., five-channel surround sound audio), and the processing device 550 is to derive portions of the received audio for all of the acoustic drivers 191, 192*a-e* and 193*a-b*, as well as an acoustic driver 894 of the subwoofer 890.

A substantial difference between the array of filters depicted in FIG. 6*b* versus FIG. 6*a* is that in FIG. 6*b*, the LR and LF audio channels are combined before being introduced to the array of filters as a single left audio channel, and the RR and RF audio channels are combined before being introduced to the array of filters as a single right audio channel. These combinations are carried out at the inputs of additional filters 690L and 690R, respectively. Another filter 690C is also added. Another substantial difference is the opportunity afforded by the addition of the filters 690L, 690C and 690R to carry out equalization or other adjustments of the resulting left and right audio channels, as well as the C audio channel, before these channels of received audio are presented to the inputs of the filters of the array of filters depicted in FIG. 6*b*.

In some embodiments, such equalization may be a room acoustics equalization derived from various tests of the acoustics of the room 900 to compensate for undesirable acoustic effects of excessively reflective and/or excessively absorptive surfaces within the room 900, as well as other undesirable acoustic characteristics of the room 900.

Figure 7:
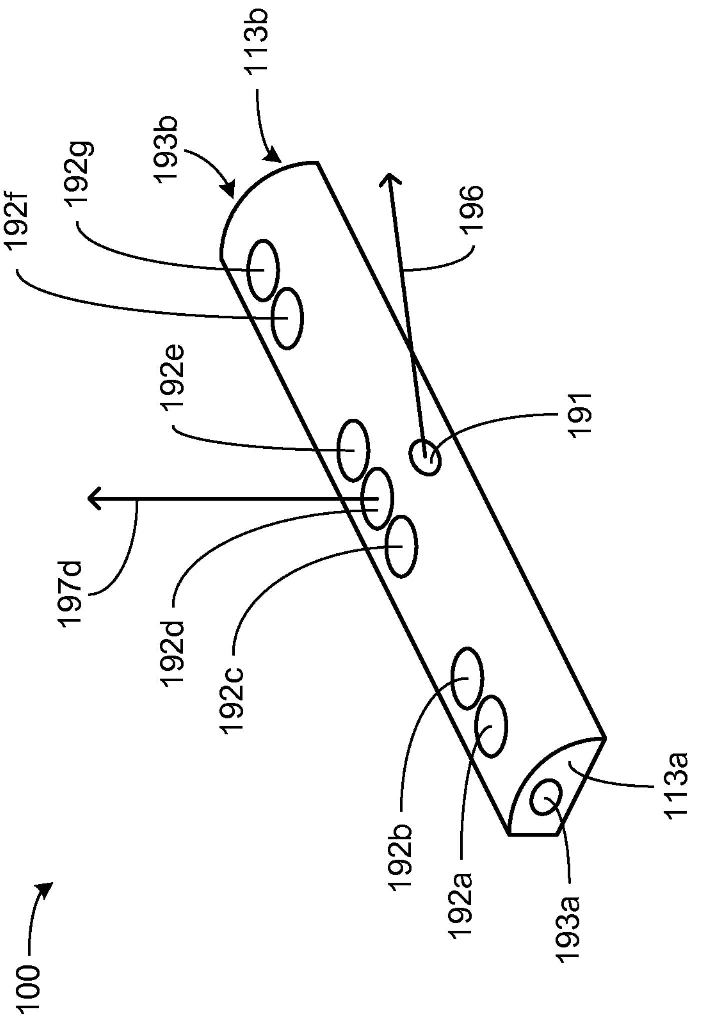
FIG. 7 is a perspective view of an alternate embodiment of the audio device of FIGS. 1*a-b*.

FIG. 7 is a perspective view, similar in orientation to that provided in FIG. 1*a*, of an alternate embodiment of the audio device 100. In this alternate embodiment, the quantity of the mid-range acoustic drivers has been increased from five to seven such that they now number from 192*a* through 192*g;* and the center-most one of these acoustic drivers is now the acoustic driver 192*d*, instead of the acoustic driver 192*c*, such that the direction of maximum acoustic radiation 197*d* now would now define the path of the axis 117. Further, the acoustic drivers 193*a-b* have been changed in their design from the earlier-depicted highly directional variant to more conventional tweeter-type acoustic drivers having a design similar to that of the acoustic driver 191; and the acoustic driver 191 is positioned relative to the acoustic driver 192*d* such that its direction of maximum acoustic radiation 196 is not perpendicular to the direction of maximum acoustic radiation 197*d*, with the result that the axis 116 would no longer be perpendicular to the axis 117. Still further, the casing of this alternate embodiment is not of a box-like configuration. Yet further, this embodiment may further incorporate an additional tweeter-type acoustic driver (similar in characteristics to the acoustic driver 191) in a manner in which it is concentrically mounted with the acoustic driver 192*d* such that its direction of maximum acoustic radiation coincides with the direction of maximum acoustic radiation 197*d*, and this embodiment of the audio device 100 may employ one or the other of the acoustic driver 191 and this concentrically-mounted tweeter-type acoustic driver in acoustically outputting higher frequency sounds of a center audio channel depending on the physical orientation of this alternate embodiment's casing relative to the direction of the force of gravity.

In this alternate embodiment, the acoustic drivers 192*a-g* are able to be operated to create acoustic interference arrays to laterally direct left and right audio sounds in very much the same manner as what has been described with regard to the previously-described embodiments. Further, the direction of the force of gravity is employed in very much the same ways previously discussed to determine what acoustic drivers to enable or disable, what filter coefficients to provide to the filters of an array of filters, and which one of the ends 193*a* and 193*b* are towards the left and towards the right of a listener at the listening position 905.

Other implementations are within the scope of the following claims and other claims to which the applicant may be entitled.

The invention claimed is:

1. An audio device comprising: a casing rotatable about an axis between a first orientation and a second orientation different from the first orientation; an orientation input device disposed on the casing to enable determination of an orientation of the casing relative to the direction of the force of gravity; a plurality of acoustic drivers disposed on the casing and facing a first direction, at least a portion of the plurality of acoustic drivers configured to form an acoustic interference array; and a first acoustic driver separate from the plurality of acoustic drivers, the first acoustic driver disposed on the casing and facing a second direction substantially orthogonal to the first direction; a processing device; a plurality of digital-to-analog converters accessible by the processing device; a plurality of audio amplifiers, of which each audio amplifier is coupled to an output of one of the digital-to-analog converters, and of which each audio amplifier is coupled to one of the acoustic drivers; and a storage accessible by the processing device in which is stored a control routine comprising a sequence of instructions that when executed by the processing device, causes the processing device to: monitor the orientation input device to determine the orientation of the casing; provide a first plurality of coefficients to a plurality of filters in response to determining that the casing is in the first orientation, wherein each filter of the plurality of filters is accessible by the processing device and an output of each filter of the plurality of filters is provided as an input to one of the digital-to-analog converters; and provide a second plurality of coefficients to the plurality of filters in response to determining that the casing is in the second orientation, and wherein: in response to the casing being in the first orientation, the first acoustic driver is enabled so that sound is acoustically output by the first acoustic driver when the casing is in the first orientation; and in response to the casing being in the second orientation, the first acoustic driver is disabled, so that sound is not acoustically output by the first acoustic driver when the casing is in the second orientation.

2. The audio device of claim 1, wherein the portion of the plurality of acoustic drivers configured to form an acoustic interference array form a laterally extending row.

3. The audio device of claim 2, wherein the casing comprises an elongate shape extending along the axis.

4. The audio device of claim 3, wherein:

the audio device is a portion of an audio system comprising the audio device and a subwoofer comprising a separate casing; and the audio device and the subwoofer cooperate in acoustically outputting audio received from another device, wherein the audio device acoustically outputs a portion of the received audio comprising sounds in a first frequency range and the subwoofer acoustically outputs a portion of the received audio comprising sounds in a second frequency range lower than the first frequency range.

5. The audio device of claim 1, wherein the orientation input device comprises a gravity detector comprising an accelerometer.

6. The audio device of claim 1, wherein the orientation input device comprises a manually operable control.

7. A method comprising: determining an orientation of a casing of an audio device about an axis relative to a direction of the force of gravity; forming a plurality of acoustic interference arrays from a plurality of acoustic drivers disposed on the casing, the plurality of acoustic drivers facing a first direction; disposing a first acoustic driver on the casing, the first acoustic driver separate from the plurality of acoustic drivers and facing a second direction substantially orthogonal to the first direction; enabling the first acoustic driver in response to the casing being in a first orientation about the axis so that sound is acoustically output through the first acoustic driver when the casing is in the first orientation; disabling the first acoustic driver in response to the casing being in a second orientation about the axis so that sound is not acoustically output through the first acoustic driver when the casing is in the second orientation; providing a first plurality of coefficients to a plurality of filters in response to determining that the casing is in the first orientation; and providing a second plurality of coefficients to the plurality of filters in response to determining that the casing is in the second orientation.

8. The audio device of claim 4, wherein the audio device comprises a wireless transmitter to provide the subwoofer with at least sounds in the second frequency range.

9. The audio device of claim 1, further comprising a first infrared sensor and a second infrared sensor, wherein:

in response to the audio device being positioned in the first orientation, the first infrared sensor is enabled so that it is configured to receive infrared signals from an external control device, and the second infrared sensor is disabled; and in response to the audio device being positioned in the second orientation, the second sensor is enabled so that it is configured to receive infrared signals from the external control device, and the first sensor is disabled.

10. The audio device of claim 1, further comprising a first visual indicator and a second visual indicator, the first visual indicator configured to be viewable to a listener when the casing is positioned in the first orientation, the second visual indicator configured to be viewable to a listener when the casing is positioned in the second orientation.

11. The audio device of claim 1, wherein the processing device is further caused by execution of the sequence of instructions to instantiate each filter of the plurality of filters.

12. The audio device of claim 1, wherein: the first and second pluralities of coefficients are stored within the storage; and the processing device is further caused by execution of the sequence of instructions to retrieve one or the other of the first and second pluralities of coefficients in response to determining the orientation of the casing to be in one of the first and second orientations.

13. The method of claim 7, further comprising instantiating each filter of the plurality of filters.

14. An audio system comprising: a casing rotatable about an axis between a first orientation and a second orientation different from the first orientation; an orientation input device to detect an orientation of the casing relative to the direction of the force of gravity; a plurality of acoustic drivers disposed on the casing, each acoustic driver operating in a first frequency range, and at least a portion of the plurality of acoustic drivers configured to form an acoustic interference array; a first acoustic driver separate from the plurality of acoustic drivers, the first acoustic driver disposed on the casing and operating in a second frequency range higher than the first frequency range; a subwoofer separate from the casing, the subwoofer comprising at least one acoustic driver to acoustically output audio in a third frequency range lower than the first frequency range, wherein: in response to the casing being in the first orientation, the first acoustic driver is enabled so that sound is acoustically output by the first acoustic driver when the casing is in the first orientation; and in response to the casing being in the second orientation, the first acoustic driver is disabled, so that sound is not acoustically output by the first acoustic driver when the casing is in the second orientation.

15. The audio system of claim 14, wherein the casing comprises a wireless transmitter to provide the subwoofer with audio signals to be acoustically output in the third frequency range.

16. The audio system of claim 14, wherein the casing comprises an elongate shape extending along the axis.

17. The audio system of claim 16, wherein the portion of the plurality of acoustic drivers configured to form an acoustic interference array form a laterally extending row.

18. The audio system of claim 14, wherein the orientation input device comprises a gravity detector comprising an accelerometer.

* * * * *